US007330995B2

(12) United States Patent
Shiraishi et al.

(10) Patent No.: US 7,330,995 B2
(45) Date of Patent: Feb. 12, 2008

(54) NONVOLATILE MEMORY APPARATUS WHICH PREVENTS DESTRUCTION OF WRITE DATA CAUSED BY POWER SHUTDOWN DURING A WRITING PROCESS

(75) Inventors: Atsushi Shiraishi, Miyakonojyo (JP); Atsushi Shikata, Higashiyamato (JP); Yasuhiro Nakamura, Tachikawa (JP); Makoto Obata, Funabashi (JP)

(73) Assignee: Renesas Technology Corp., Tokyo (JP)

( * ) Notice: Subject to any disclaimer, the term of this patent is extended or adjusted under 35 U.S.C. 154(b) by 261 days.

(21) Appl. No.: 11/076,563

(22) Filed: Mar. 10, 2005

(65) Prior Publication Data

US 2005/0201177 A1 Sep. 15, 2005

(30) Foreign Application Priority Data

Mar. 12, 2004 (JP) ............................ 2004-070133

(51) Int. Cl.
*G06F 11/00* (2006.01)

(52) U.S. Cl. ............................ 714/2; 714/24; 711/103; 711/154

(58) Field of Classification Search ................ 711/103, 711/206, 156, 154, 162; 365/185.33; 714/2, 714/24

See application file for complete search history.

(56) References Cited

U.S. PATENT DOCUMENTS 5,644,539 A 7/1997 Yamagami et al. ......... 365/200
5,694,538 A * 12/1997 Okazaki et al. ............... 714/15
6,014,755 A * 1/2000 Wells et al. .................... 714/8
7,191,308 B2 * 3/2007 Hara et al. .................. 711/213
2001/0023472 A1 * 9/2001 Kubushiro et al. ......... 711/103
2004/0065744 A1 * 4/2004 Shiraishi et al. ............ 235/492
2004/0114431 A1 * 6/2004 Shona .................. 365/185.11
2005/0182892 A1 * 8/2005 Nakanishi et al. .......... 711/103

FOREIGN PATENT DOCUMENTS

JP 5-204561 8/1993

* cited by examiner

*Primary Examiner*—Hong Kim
(74) *Attorney, Agent, or Firm*—Miles & Stockbridge P.C.

(57) ABSTRACT

The present invention is directed to suppress data loss caused by power shut-down during a rewriting process and to shorten time required to make a depletion check.

A nonvolatile memory apparatus includes a rewritable nonvolatile memory and a card controller. The nonvolatile memory has a physical address area corresponding to a logical address and a save area. In response to a data rewrite instruction on a required logical address, the card controller stores data in a predetermined physical address area corresponding to the logical address to the save area and rewrites the data stored in the physical address area. When rewriting of the physical address area is incomplete, the card controller rewrites the data in the physical address area with the data stored in the save area. Thus, data loss caused by the power shut-down can be suppressed by data backup, and it is sufficient to make the depletion check in two places of the save area and the physical address area.

12 Claims, 30 Drawing Sheets

(PHYSICAL ADDRESS)    (MANAGEMENT INFORMATION)

| | DAT | ADR | FLG | |
|---|---|---|---|---|
| | | | | } 23 |
| PA | OLD DATA | LA | VALID | |
| | ⋮ | | | |
| MA | OLD DATA | LA | IN USE | } 22 |
| | ⋮ | | | |
| | | | | } 23 |

SAVE: PA → MA (PHYSICAL ADDRESS)    (MANAGEMENT INFORMATION)

| | DAT | ADR | FLG | |
|---|---|---|---|---|
| PA | NEW DATA | LA | VALID | } 23 |
| | ⋮ | | | |
| MA | OLD DATA | LA | IN USE | } 22 |
| | ⋮ | | | |
| | | | | } 23 |

FIG. 8
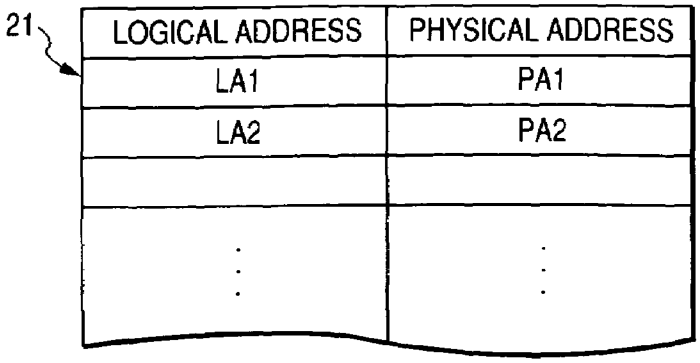
FIG. 9
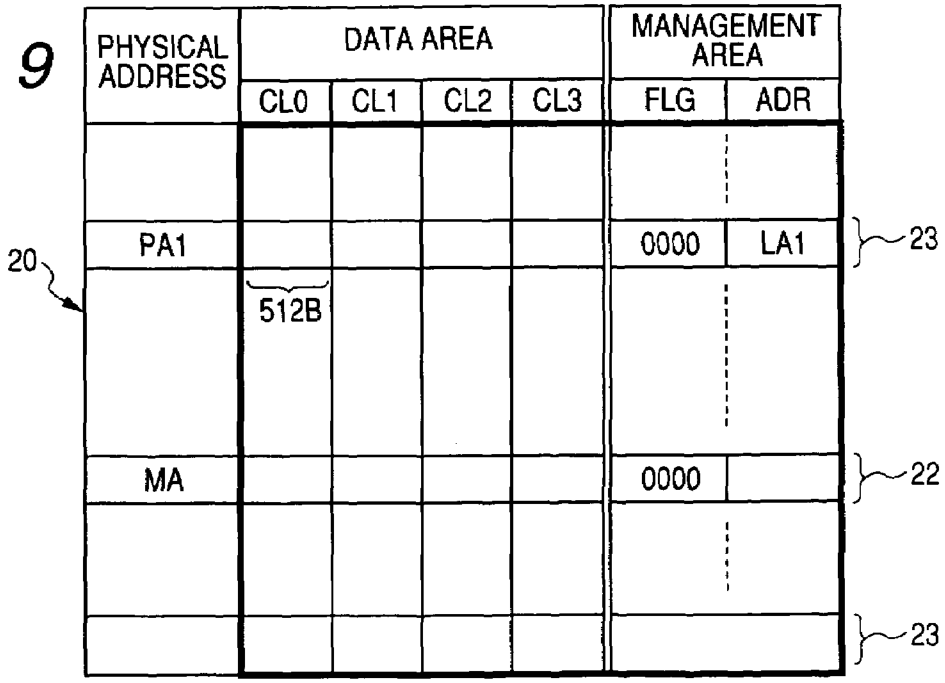
FIG. 10
| | | |
|---|---|---|
| DATA AREA | FLAG | F000: COLUMN 0 VALID 0F0h: COLUMN 1 VALID<br>00F0: COLUMN 2 VALID 000F: COLUMN 3 VALID |
| | ADDRESS | LOGICAL ADDRESS |
| SAVE AREA | FLAG | 0000: UNUSED FF00: IN USE FFFF: USED |
| | ADDRESS | LOGICAL ADDRESS OF SAVE SOURCE |

| PHYSICAL ADDRESS | DATA AREA | | | | MANAGEMENT AREA | | |
|---|---|---|---|---|---|---|---|
| | CL0 | CL1 | CL2 | CL3 | FLG | ADR | |
| | | | | | | | |
| PA1 | D1 | D2 | D3 | D4 | FFFF | LA1 | }~23 |
| | | | | | | | |
| MA | | | | | 0000 | | }~22 |
| | | | | | | | |

| PHYSICAL ADDRESS | DATA AREA | | | | MANAGEMENT AREA | | |
|---|---|---|---|---|---|---|---|
| | CL0 | CL1 | CL2 | CL3 | FLG | ADR | |
| | | | | | | | |
| PA1 | D1 | D2 | D3 | D4 | FFFF | LA1 | }~23 |
| | ↓ | ↓ | ↓ | ↓ | | | |
| MA | D1 | D2 | D3 | D4 | FF00 | LA1 | }~22 |
| | | | | | | | |

FIG. 13

| PHYSICAL ADDRESS | DATA AREA | | | | MANAGEMENT AREA | | |
|---|---|---|---|---|---|---|---|
| | CL0 | CL1 | CL2 | CL3 | FLG | ADR | |
| | | | | | | | |
| PA1 | | | | | | | 23 |
| | | | | | | | |
| MA | D1 | D2 | D3 | D4 | FF00 | LA1 | 22 |
| | | | | | | | |

FIG. 14

| PHYSICAL ADDRESS | DATA AREA | | | | MANAGEMENT AREA | | |
|---|---|---|---|---|---|---|---|
| | CL0 | CL1 | CL2 | CL3 | FLG | ADR | |
| | | | | | | | |
| PA1 | D5 | D6 | D7 | D8 | FFFF | LA1 | 23 |
| | | | | | | | |
| MA | D1 | D2 | D3 | D4 | FFFF | LA1 | 22 |
| | | | | | | | |

| PHYSICAL ADDRESS | DATA AREA | | | | MANAGEMENT AREA | |
|---|---|---|---|---|---|---|
| | CL0 | CL1 | CL2 | CL3 | FLG | ADR |
| | | | | | | |
| PA1 | D5 | D6 | D7 | | FFF0 | LA1 | }~23
| | | | | | | |
| MA | D1 | D2 | D3 | D4 | FF00 | LA1 | }~22
| | | | | | | |

| PHYSICAL ADDRESS | DATA AREA | | | | MANAGEMENT AREA | |
|---|---|---|---|---|---|---|
| | CL0 | CL1 | CL2 | CL3 | FLG | ADR |
| | | | | | | |
| PA1 | D5 | D6 | D7 | D8 | FFFF | LA1 | }~23
| | | | | | | |
| MA | D1 | D2 | D3 | D4 | FFFF | LA1 | }~22
| | | | | | | |

FIG. 17

| PHYSICAL ADDRESS | DATA AREA | | | | MANAGEMENT AREA | | |
|---|---|---|---|---|---|---|---|
| | CL0 | CL1 | CL2 | CL3 | FLG | ADR | |
| | | | | | | | |
| PA1 | D5 | D6 | D7 | | FFF0 | LA1 | 23 |
| | | | | | | | |
| PA2 | D9 | D10 | D11 | D12 | FFFF | LA2 | 23 |
| | | | | | | | |
| MA | D1 | D2 | D3 | D4 | FFFF | LA1 | 22 |
| | | | | | | | |

FIG. 18

| PHYSICAL ADDRESS | DATA AREA | | | | MANAGEMENT AREA | | |
|---|---|---|---|---|---|---|---|
| | CL0 | CL1 | CL2 | CL3 | FLG | ADR | |
| | | | | | | | |
| PA1 | D5 | D6 | D7 | D4 | FFFF | LA1 | 23 |
| | | | | | | | |
| PA2 | D9 | D10 | D11 | D12 | FFFF | LA2 | 23 |
| | | | | | | | |
| MA | D1 | D2 | D3 | D4 | FFFF | LA1 | 22 |
| | | | | | | | |

| PHYSICAL ADDRESS | DATA AREA | | | | MANAGEMENT AREA | | |
|---|---|---|---|---|---|---|---|
| | CL0 | CL1 | CL2 | CL3 | FLG | ADR | |
| | | | | | | | |
| PA1 | D5 | D6 | D7 | D4 | FFFF | LA1 | }~23 |
| | | | | | | | |
| PA2 | D9 | D10 | D11 | D12 | FFFF | LA2 | }~23 |
| | | | | | | | |
| MA | | | | | | | }~22 |
| | | | | | | | |

| PHYSICAL ADDRESS | DATA AREA | | | | MANAGEMENT AREA | | |
|---|---|---|---|---|---|---|---|
| | CL0 | CL1 | CL2 | CL3 | FLG | ADR | |
| | | | | | | | |
| PA1 | D5 | D6 | D7 | D4 | FFFF | LA1 | }~23 |
| | | | | | | | |
| PA2 | D9 | D10 | D11 | D12 | FFFF | LA2 | }~23 |
| MA | D9 | D10 | D11 | D12 | FF00 | LA2 | }~22 |
| | | | | | | | |

FIG. 21

| PHYSICAL ADDRESS | DATA AREA | | | | MANAGEMENT AREA | | |
|---|---|---|---|---|---|---|---|
| | CL0 | CL1 | CL2 | CL3 | FLG | ADR | |
| | | | | | | | |
| PA1 | D5 | D6 | D7 | D4 | FFFF | LA1 | 23 |
| | | | | | | | |
| PA2 | | | | | | | 23 |
| | | | | | | | |
| MA | D9 | D10 | D11 | D12 | FF00 | LA2 | 22 |
| | | | | | | | |

FIG. 22

| PHYSICAL ADDRESS | DATA AREA | | | | MANAGEMENT AREA | | |
|---|---|---|---|---|---|---|---|
| | CL0 | CL1 | CL2 | CL3 | FLG | ADR | |
| | | | | | | | |
| PA1 | D5 | D6 | D7 | D4 | FFFF | LA1 | 23 |
| | | | | | | | |
| PA2 | D13 | D14 | D15 | D16 | FFFF | LA2 | 23 |
| | | | | | | | |
| MA | D9 | D10 | D11 | D12 | FFFF | LA2 | 22 |
| | | | | | | | |

FIG. 26

| LOGICAL ADDRESS | PHYSICAL ADDRESS |
| --- | --- |
| LA0 | PA0 HIGH-ORDER SIDE |
| LA1 | PA1 HIGH-ORDER SIDE |
| LA2 | PA0 LOW-ORDER SIDE |
| LA3 | PA1 LOW-ORDER SIDE |
| LA4 | PA2 HIGH-ORDER SIDE |
| LA5 | PA3 HIGH-ORDER SIDE |
| LA6 | PA2 LOW-ORDER SIDE |
| LA7 | PA3 LOW-ORDER SIDE |
| ⋮ | ⋮ |

| BNK0 | | | | |
|---|---|---|---|---|
| CL0 | CL1 | CL2 | CL3 | FLG | ADR |
| 0 | 1 | 2 | 3 | FFFF | LA0 |
| 8 | 9 | A | B | FFFF | LA2 |

PA0 ⎧ 23

| CL0 | CL1 | CL2 | CL3 | FLG | ADR |
|---|---|---|---|---|---|
|  |  |  |  | 0000 | 0000 |
|  |  |  |  | 0000 | 0000 |

MA0 ⎧ 22

| BNK1 — 7FFC | | | | |
|---|---|---|---|---|
| CL0 | CL1 | CL2 | CL3 | FLG | ADR |
| 4 | 5 | 6 | 7 | FFFF | LA1 |
| C | D | E | F | FFFF | LA3 |

PA1 ⎧ 23

| CL0 | CL1 | CL2 | CL3 | FLG | ADR |
|---|---|---|---|---|---|
|  |  |  |  | 0000 | 0000 |
|  |  |  |  | 0000 | 0000 |

MA1 ⎧ 22

| BNK2 | | | | |
|---|---|---|---|---|
| CL0 | CL1 | CL2 | CL3 | FLG | ADR |
| 10 | 11 | 12 | 13 | FFFF | LA4 |
| 18 | 19 | 1A | 1B | FFFF | LA6 |

PA2 ⎧ 23

| CL0 | CL1 | CL2 | CL3 | FLG | ADR |
|---|---|---|---|---|---|
|  |  |  |  | 0000 | 0000 |
|  |  |  |  | 0000 | 0000 |

MA2 ⎧ 22

| BNK3 | | | | |
|---|---|---|---|---|
| CL0 | CL1 | CL2 | CL3 | FLG | ADR |
| 14 | 15 | 16 | 17 | FFFF | LA5 |
| 1C | 1D | 1E | 1F | FFFF | LA7 |

PA3 ⎧ 23

| CL0 | CL1 | CL2 | CL3 | FLG | ADR |
|---|---|---|---|---|---|
|  |  |  |  | 0000 | 0000 |
|  |  |  |  | 0000 | 0000 |

MA3 ⎧ 22

BNK0

PA0
| CL0 | CL1 | CL2 | CL3 | FLG | ADR |
|---|---|---|---|---|---|
| 0 | 1 | 2 | 3 | FFFF | |
| 8 | 9 | A | B | FFFF | LA2 |

MA0
| CL0 | CL1 | CL2 | CL3 | FLG | ADR |
|---|---|---|---|---|---|
| 0 | 1 | 2 | 3 | FF00 | LA0 |
| | | | | 0000 | 0000 |

BNK1

PA1
| CL0 | CL1 | CL2 | CL3 | FLG | ADR |
|---|---|---|---|---|---|
| 4 | 5 | 6 | 7 | FFFF | LA1 |
| C | D | E | F | FFFF | LA3 |

MA1
| CL0 | CL1 | CL2 | CL3 | FLG | ADR |
|---|---|---|---|---|---|
| 4 | 5 | 6 | 7 | FF00 | LA1 |
| | | | | 0000 | |

BNK2

PA2
| CL0 | CL1 | CL2 | CL3 | FLG | ADR |
|---|---|---|---|---|---|
| 10 | 11 | 12 | 13 | FFFF | LA4 |
| 18 | 19 | 1A | 1B | FFFF | LA6 |

MA2
| CL0 | CL1 | CL2 | CL3 | FLG | ADR |
|---|---|---|---|---|---|
| 8 | 9 | A | B | FF00 | LA2 |
| | | | | 0000 | 0000 |

BNK3

PA3
| CL0 | CL1 | CL2 | CL3 | FLG | ADR |
|---|---|---|---|---|---|
| 14 | 15 | 16 | 17 | FFFF | LA5 |
| 1C | 1D | 1E | 1F | FFFF | LA7 |

MA3
| CL0 | CL1 | CL2 | CL3 | FLG | ADR |
|---|---|---|---|---|---|
| C | D | E | F | FF00 | LA3 |
| | | | | 0000 | 0000 |

| | CL0 | CL1 | CL2 | CL3 | FLG | ADR |
|---|---|---|---|---|---|---|
| PA3 | 14 | 15 | 16 | 17 | FFFF | LA5 |
| | 1C | 1D | 1E | 1F | FFFF | LA7 |

| | CL0 | CL1 | CL2 | CL3 | FLG | ADR |
|---|---|---|---|---|---|---|
| MA3 | C | D | E | F | FF00 | LA3 |
| | | | | | 0000 | 0000 |

BNK3

| | CL0 | CL1 | CL2 | CL3 | FLG | ADR |
|---|---|---|---|---|---|---|
| PA2 | 10 | 11 | 12 | 13 | FFFF | LA4 |
| | 18 | 19 | 1A | 1B | FFFF | LA6 |

| | CL0 | CL1 | CL2 | CL3 | FLG | ADR |
|---|---|---|---|---|---|---|
| MA2 | 8 | 9 | A | B | FF00 | LA2 |
| | | | | | 0000 | 0000 |

BNK2

| | CL0 | CL1 | CL2 | CL3 | FLG | ADR |
|---|---|---|---|---|---|---|
| PA1 | | | | | | |
| | | | | | | |

| | CL0 | CL1 | CL2 | CL3 | FLG | ADR |
|---|---|---|---|---|---|---|
| MA1 | 4 | 5 | 6 | 7 | FF00 | LA1 |
| | | | | | 0000 | 0000 |

BNK1

| | CL0 | CL1 | CL2 | CL3 | FLG | ADR |
|---|---|---|---|---|---|---|
| PA0 | | | | | | |
| | | | | | | |

| | CL0 | CL1 | CL2 | CL3 | FLG | ADR |
|---|---|---|---|---|---|---|
| MA0 | 0 | 1 | 2 | 3 | FF00 | LA0 |
| | | | | | 0000 | 0000 |

BNK0

BNK0:
PA0 (23): 
| CL0 | CL1 | CL2 | CL3 | FLG | ADR |
|---|---|---|---|---|---|
| A0 | A1 | A2 | | FFF0 | LA0 |
| | | | | 0000 | LA2 |

MA0 (22):
| CL0 | CL1 | CL2 | CL3 | FLG | ADR |
|---|---|---|---|---|---|
| 0 | 1 | 2 | 3 | FF00 | LA0 |
| | | | | 0000 | 0000 |

BNK1:
PA1 (23):
| CL0 | CL1 | CL2 | CL3 | FLG | ADR |
|---|---|---|---|---|---|
| | | | | 0000 | LA1 |
| | | | | 0000 | LA3 |

MA1 (22):
| CL0 | CL1 | CL2 | CL3 | FLG | ADR |
|---|---|---|---|---|---|
| 4 | 5 | 6 | 7 | FF00 | LA1 |
| | | | | 0000 | 0000 |

BNK2:
PA2 (23):
| CL0 | CL1 | CL2 | CL3 | FLG | ADR |
|---|---|---|---|---|---|
| 10 | 11 | 12 | 13 | FFFF | LA4 |
| 18 | 19 | 1A | 1B | FFFF | LA6 |

MA2 (22):
| CL0 | CL1 | CL2 | CL3 | FLG | ADR |
|---|---|---|---|---|---|
| 8 | 9 | A | B | FF00 | LA2 |
| | | | | 0000 | 0000 |

BNK3:
PA3 (23):
| CL0 | CL1 | CL2 | CL3 | FLG | ADR |
|---|---|---|---|---|---|
| 14 | 15 | 16 | 17 | FFFF | LA5 |
| 1C | 1D | 1E | 1F | FFFF | LA7 |

MA3 (22):
| CL0 | CL1 | CL2 | CL3 | FLG | ADR |
|---|---|---|---|---|---|
| C | D | E | F | FF00 | LA3 |
| | | | | 0000 | 0000 |

BNK0

| | CL0 | CL1 | CL2 | CL3 | FLG | ADR |
|---|---|---|---|---|---|---|
| PA0 | A0 | A1 | A2 | | FFF0 | PA0 |
| | | | | | 0000 | PA0 |

| | CL0 | CL1 | CL2 | CL3 | FLG | ADR |
|---|---|---|---|---|---|---|
| MA0 | 0 | 1 | 2 | 3 | FF00 | LA0 |
| | 18 | 19 | 1A | 1B | FF00 | LA6 |

BNK1

| | CL0 | CL1 | CL2 | CL3 | FLG | ADR |
|---|---|---|---|---|---|---|
| PA1 | | | | | 0000 | PA1 |
| | | | | | 0000 | PA1 |

| | CL0 | CL1 | CL2 | CL3 | FLG | ADR |
|---|---|---|---|---|---|---|
| MA1 | 4 | 5 | 6 | 7 | FF00 | LA1 |
| | 1C | 1D | 1E | 1F | FF00 | LA7 |

BNK2

| | CL0 | CL1 | CL2 | CL3 | FLG | ADR |
|---|---|---|---|---|---|---|
| PA2 | | | | | | |
| | | | | | | |

| | CL0 | CL1 | CL2 | CL3 | FLG | ADR |
|---|---|---|---|---|---|---|
| MA2 | 8 | 9 | A | B | FF00 | LA2 |
| | 10 | 11 | 12 | 13 | FF00 | LA4 |

BNK3

| | CL0 | CL1 | CL2 | CL3 | FLG | ADR |
|---|---|---|---|---|---|---|
| PA3 | | | | | | |
| | | | | | | |

| | CL0 | CL1 | CL2 | CL3 | FLG | ADR |
|---|---|---|---|---|---|---|
| MA3 | C | D | E | F | FF00 | LA3 |
| | 14 | 15 | 16 | 17 | FF00 | LA5 |

BNK0

PA0

| CL0 | CL1 | CL2 | CL3 | FLG | ADR |
|---|---|---|---|---|---|
| A0 | A1 | A2 | | FFF0 | LA0 |
| | | | | 0000 | LA2 |

MA0

| CL0 | CL1 | CL2 | CL3 | FLG | ADR |
|---|---|---|---|---|---|
| 0 | 1 | 2 | 3 | FF00 | LA0 |
| 18 | 19 | 1A | 1B | FF00 | LA6 |

BNK1

PA1

| CL0 | CL1 | CL2 | CL3 | FLG | ADR |
|---|---|---|---|---|---|
| | | | | 0000 | LA1 |
| | | | | 0000 | LA3 |

MA1

| CL0 | CL1 | CL2 | CL3 | FLG | ADR |
|---|---|---|---|---|---|
| 4 | 5 | 6 | 7 | FF00 | LA1 |
| 1C | 1D | 1E | 1F | FF00 | LA7 |

BNK2

PA2

| CL0 | CL1 | CL2 | CL3 | FLG | ADR |
|---|---|---|---|---|---|
| | | | | 0000 | LA4 |
| | | | | 0000 | LA6 |

MA2

| CL0 | CL1 | CL2 | CL3 | FLG | ADR |
|---|---|---|---|---|---|
| 8 | 9 | A | B | FF00 | LA2 |
| 10 | 11 | 12 | 13 | FF00 | LA4 |

BNK3

PA3

| CL0 | CL1 | CL2 | CL3 | FLG | ADR |
|---|---|---|---|---|---|
| B5 | B6 | B7 | | 0FFF | LA5 |
| | | | | 0000 | LA7 |

MA3

| CL0 | CL1 | CL2 | CL3 | FLG | ADR |
|---|---|---|---|---|---|
| C | D | E | F | FF00 | LA3 |
| 14 | 15 | 16 | 17 | FF00 | LA5 |

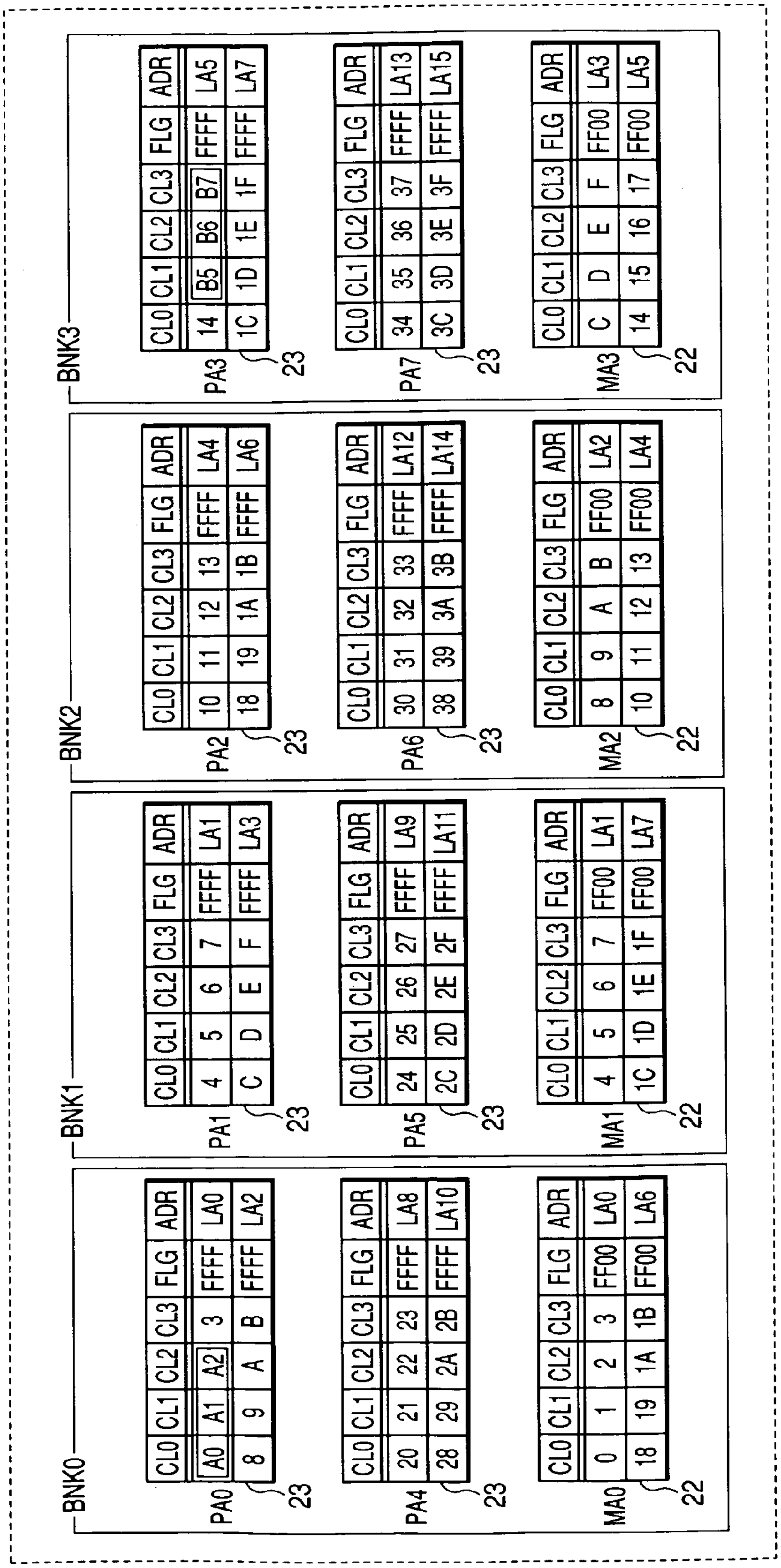

FIG. 35

BNK0

| CL0 | CL1 | CL2 | CL3 | FLG | ADR |
|---|---|---|---|---|---|
| A0 | A1 | A2 | 3 | FFFF | LA0 |
| 8 | 9 | A | B | FFFF | LA2 |

PA0 ⎰ 23

| CL0 | CL1 | CL2 | CL3 | FLG | ADR |
|---|---|---|---|---|---|
| 20 | 21 | 22 | 23 | FFFF | LA8 |
| 28 | 29 | 2A | 2B | FFFF | LA10 |

PA4 ⎰ 23

| CL0 | CL1 | CL2 | CL3 | FLG | ADR |
|---|---|---|---|---|---|
| 0 | 1 | 2 | 3 | FF00 | LA0 |
| 18 | 19 | 1A | 1B | FF00 | LA6 |

MA0 ⎰ 22

BNK1

| CL0 | CL1 | CL2 | CL3 | FLG | ADR |
|---|---|---|---|---|---|
| 4 | 5 | 6 | 7 | FFFF | LA1 |
| C | D | E | F | FFFF | LA3 |

PA1 ⎰ 23

| CL0 | CL1 | CL2 | CL3 | FLG | ADR |
|---|---|---|---|---|---|
| 24 | 25 | 26 | 27 | FFFF | LA9 |
| 2C | 2D | 2E | 2F | FFFF | LA11 |

PA5 ⎰ 23

| CL0 | CL1 | CL2 | CL3 | FLG | ADR |
|---|---|---|---|---|---|
| 4 | 5 | 6 | 7 | FF00 | LA1 |
| 1C | 1D | 1E | 1F | FF00 | LA7 |

MA1 ⎰ 22

BNK2

| CL0 | CL1 | CL2 | CL3 | FLG | ADR |
|---|---|---|---|---|---|
| 10 | 11 | 12 | 13 | FFFF | LA4 |
| 18 | 19 | 1A | 1B | FFFF | LA6 |

PA2 ⎰ 23

| CL0 | CL1 | CL2 | CL3 | FLG | ADR |
|---|---|---|---|---|---|
| 30 | 31 | 32 | 33 | FFFF | LA12 |
| 38 | 39 | 3A | 3B | FFFF | LA14 |

PA6 ⎰ 23

| CL0 | CL1 | CL2 | CL3 | FLG | ADR |
|---|---|---|---|---|---|
| 8 | 9 | A | B | FF00 | LA2 |
| 10 | 11 | 12 | 13 | FF00 | LA4 |

MA2 ⎰ 22

BNK3

| CL0 | CL1 | CL2 | CL3 | FLG | ADR |
|---|---|---|---|---|---|
| 14 | B5 | B6 | B7 | FFFF | LA5 |
| 1C | 1D | 1E | 1F | FFFF | LA7 |

PA3 ⎰ 23

| CL0 | CL1 | CL2 | CL3 | FLG | ADR |
|---|---|---|---|---|---|
| 34 | 35 | 36 | 37 | FFFF | LA13 |
| 3C | 3D | 3E | 3F | FFFF | LA15 |

PA7 ⎰ 23

| CL0 | CL1 | CL2 | CL3 | FLG | ADR |
|---|---|---|---|---|---|
| C | D | E | F | FF00 | LA3 |
| 14 | 15 | 16 | 17 | FF00 | LA5 |

MA3 ⎰ 22

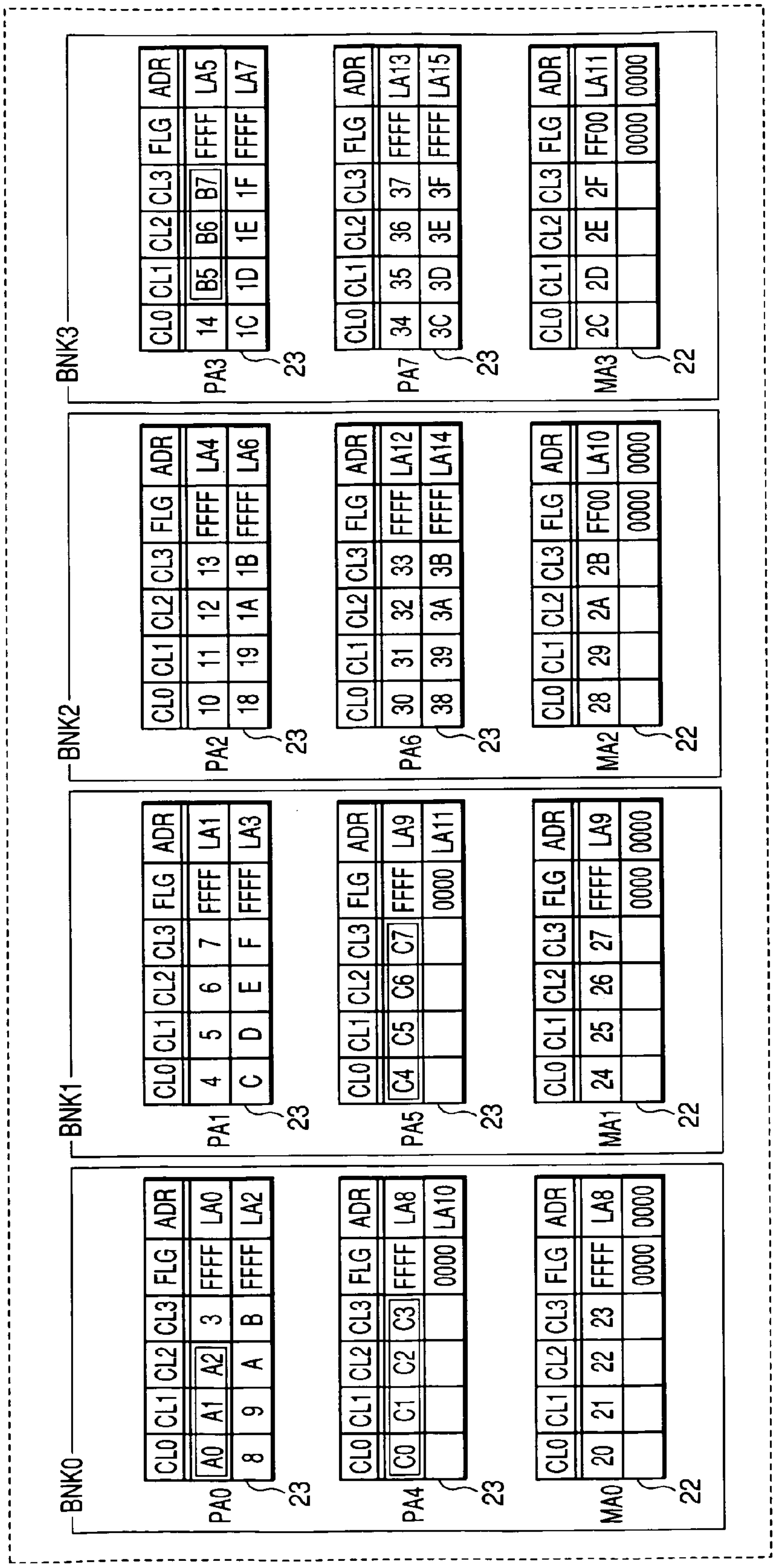

FIG. 39

BNK0

| CL0 | CL1 | CL2 | CL3 | FLG | ADR |
|-----|-----|-----|-----|-----|-----|
| A0 | A1 | A2 | 3 | FFFF | LA0 |
| 8 | 9 | A | B | FFFF | LA2 |

PA0 }23

| CL0 | CL1 | CL2 | CL3 | FLG | ADR |
|-----|-----|-----|-----|-----|-----|
| C0 | C1 | C2 | C3 | FFFF | LA8 |
|  |  |  |  | 0000 | LA10 |

PA4 }23

| CL0 | CL1 | CL2 | CL3 | FLG | ADR |
|-----|-----|-----|-----|-----|-----|
| 20 | 21 | 22 | 23 | FFFF | LA8 |
|  |  |  |  | 0000 | 0000 |

MA0 }22

BNK1

| CL0 | CL1 | CL2 | CL3 | FLG | ADR |
|-----|-----|-----|-----|-----|-----|
| 4 | 5 | 6 | 7 | FFFF | LA1 |
| C | D | E | F | FFFF | LA3 |

PA1 }23

| CL0 | CL1 | CL2 | CL3 | FLG | ADR |
|-----|-----|-----|-----|-----|-----|
| C4 | C5 | C6 | C7 | FFFF | LA9 |
|  |  |  |  | 0000 | LA11 |

PA5 }23

| CL0 | CL1 | CL2 | CL3 | FLG | ADR |
|-----|-----|-----|-----|-----|-----|
| 24 | 25 | 26 | 27 | FFFF | LA9 |
|  |  |  |  | 0000 | 0000 |

MA1 }22

BNK2

| CL0 | CL1 | CL2 | CL3 | FLG | ADR |
|-----|-----|-----|-----|-----|-----|
| 10 | 11 | 12 | 13 | FFFF | LA4 |
| 18 | 19 | 1A | 1B | FFFF | LA6 |

PA2 }23

| CL0 | CL1 | CL2 | CL3 | FLG | ADR |
|-----|-----|-----|-----|-----|-----|
| 30 | 31 | 32 | 33 | FFFF | LA12 |
| 38 | 39 | 3A | 3B | FFFF | LA14 |

PA6 }23

| CL0 | CL1 | CL2 | CL3 | FLG | ADR |
|-----|-----|-----|-----|-----|-----|
| 28 | 29 | 2A | 2B | FF00 | LA10 |
|  |  |  |  | 0000 | 0000 |

MA2 }22

BNK3

| CL0 | CL1 | CL2 | CL3 | FLG | ADR |
|-----|-----|-----|-----|-----|-----|
| 14 | B5 | B6 | B7 | FFFF | LA5 |
| 1C | 1D | 1E | 1F | FFFF | LA7 |

PA3 }23

| CL0 | CL1 | CL2 | CL3 | FLG | ADR |
|-----|-----|-----|-----|-----|-----|
| 34 | 35 | 36 | 37 | FFFF | LA13 |
| 3C | 3D | 3E | 3F | FFFF | LA15 |

PA7 }23

| CL0 | CL1 | CL2 | CL3 | FLG | ADR |
|-----|-----|-----|-----|-----|-----|
| 2C | 2D | 2E | 2F | FF00 | LA11 |
|  |  |  |  | 0000 | 0000 |

MA3 }22

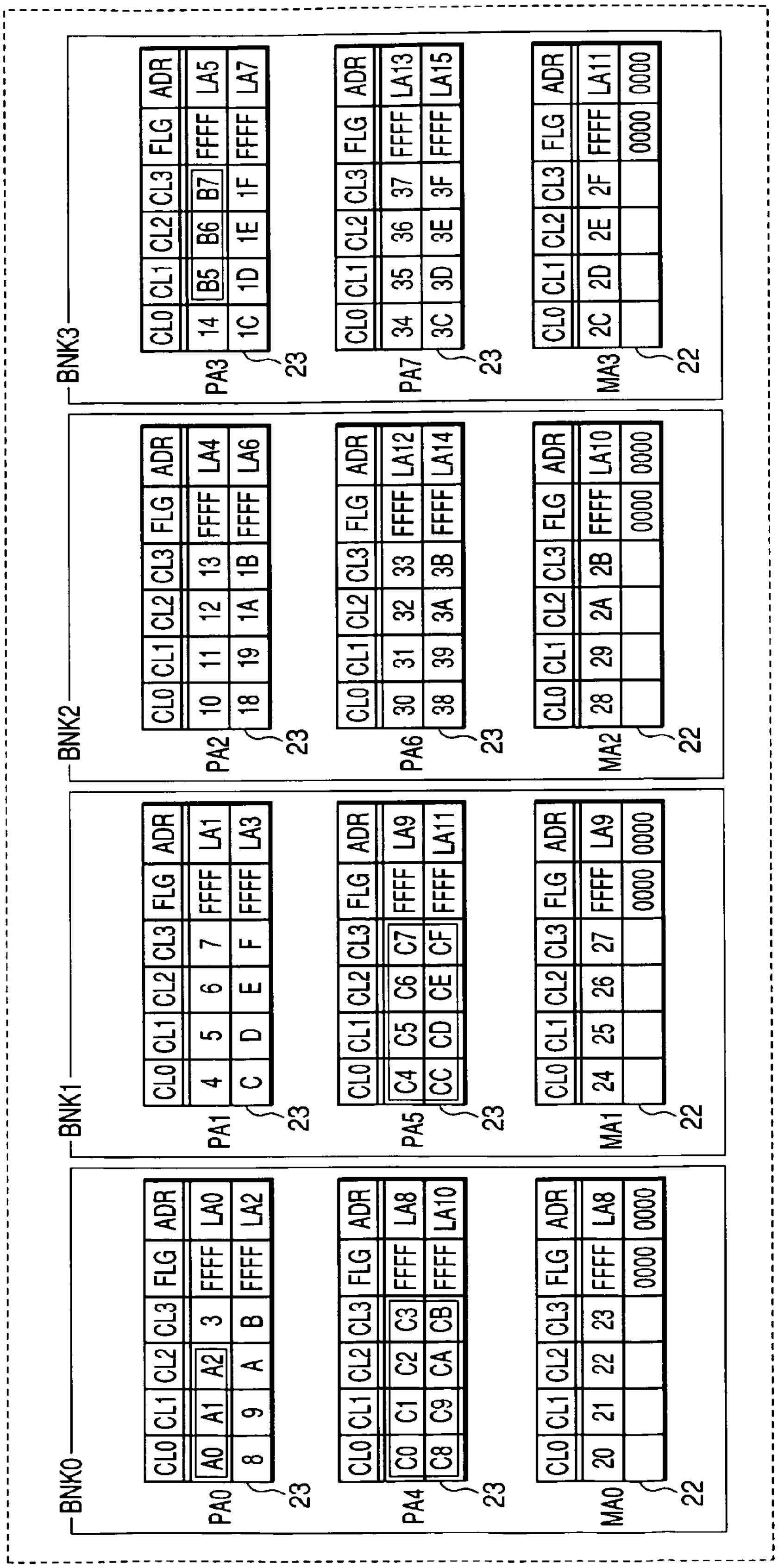

FIG. 40

BNK0

PA0: 
| CL0 | CL1 | CL2 | CL3 | FLG | ADR |
|---|---|---|---|---|---|
| A0 | A1 | A2 | 3 | FFFF | LA0 |
| 8 | 9 | A | B | FFFF | LA2 |

PA4:
| CL0 | CL1 | CL2 | CL3 | FLG | ADR |
|---|---|---|---|---|---|
| C0 | C1 | C2 | C3 | FFFF | LA8 |
| C8 | C9 | CA | CB | FFFF | LA10 |

MA0:
| CL0 | CL1 | CL2 | CL3 | FLG | ADR |
|---|---|---|---|---|---|
| 20 | 21 | 22 | 23 | FFFF | LA8 |
|    |    |    |    | 0000 | 0000 |

BNK1

PA1:
| CL0 | CL1 | CL2 | CL3 | FLG | ADR |
|---|---|---|---|---|---|
| 4 | 5 | 6 | 7 | FFFF | LA1 |
| C | D | E | F | FFFF | LA3 |

PA5:
| CL0 | CL1 | CL2 | CL3 | FLG | ADR |
|---|---|---|---|---|---|
| C4 | C5 | C6 | C7 | FFFF | LA9 |
| CC | CD | CE | CF | FFFF | LA11 |

MA1:
| CL0 | CL1 | CL2 | CL3 | FLG | ADR |
|---|---|---|---|---|---|
| 24 | 25 | 26 | 27 | FFFF | LA9 |
|    |    |    |    | 0000 | 0000 |

BNK2

PA2:
| CL0 | CL1 | CL2 | CL3 | FLG | ADR |
|---|---|---|---|---|---|
| 10 | 11 | 12 | 13 | FFFF | LA4 |
| 18 | 19 | 1A | 1B | FFFF | LA6 |

PA6:
| CL0 | CL1 | CL2 | CL3 | FLG | ADR |
|---|---|---|---|---|---|
| 30 | 31 | 32 | 33 | FFFF | LA12 |
| 38 | 39 | 3A | 3B | FFFF | LA14 |

MA2:
| CL0 | CL1 | CL2 | CL3 | FLG | ADR |
|---|---|---|---|---|---|
| 28 | 29 | 2A | 2B | FFFF | LA10 |
|    |    |    |    | 0000 | 0000 |

BNK3

PA3:
| CL0 | CL1 | CL2 | CL3 | FLG | ADR |
|---|---|---|---|---|---|
| 14 | B5 | B6 | B7 | FFFF | LA5 |
| 1C | 1D | 1E | 1F | FFFF | LA7 |

PA7:
| CL0 | CL1 | CL2 | CL3 | FLG | ADR |
|---|---|---|---|---|---|
| 34 | 35 | 36 | 37 | FFFF | LA13 |
| 3C | 3D | 3E | 3F | FFFF | LA15 |

MA3:
| CL0 | CL1 | CL2 | CL3 | FLG | ADR |
|---|---|---|---|---|---|
| 2C | 2D | 2E | 2F | FFFF | LA11 |
|    |    |    |    | 0000 | 0000 |

NONVOLATILE MEMORY APPARATUS WHICH PREVENTS DESTRUCTION OF WRITE DATA CAUSED BY POWER SHUTDOWN DURING A WRITING PROCESS

BACKGROUND OF THE INVENTION

The present invention relates to a memory card having an electrically rewritable nonvolatile memory and a card controller and, more particularly, to a technique solving an inconvenience caused by power shut-down during rewriting and a technique effective when applied to, for example, a flash memory card Japanese Unexamined Patent Publication No. Hei 5 (1993)-204561 (U.S. Pat. No. 5,644,539) discloses a configuration that a flash memory mounted on a memory card has a data memory area for storing file data, a spare memory area replacing an error area, and an error memory area for storing error information of the data memory area. In the error memory area, the address of a spare memory replacing a data memory which becomes erroneous is stored.

SUMMARY OF THE INVENTION

In the conventional technique, however, in order to retrieve a spare area at the time of rewriting, a process of sequentially reading management information of physical sectors or a process of reading the address of a spare memory or the like from the error memory area has to be performed. In short, to retrieve a vacant sector on which writing is to be performed, the process of sequentially reading information from physical sectors is necessary and it regulates a high-speed access.

The inventors herein have examined that when the power source is turned off during a writing process in a flash memory card, data being written is destroyed and, moreover, data other than write data disappears and, further, there is the possibility that data in a wider range disappears due to depletion.

Specifically, at the time of rewriting information stored in a flash memory, data in an erase unit in a rewrite area is saved in a buffer. After that, an erasing process is performed and, then, a writing process is performed. If the operation power source is interrupted before completion of rewriting, the saved data is lost from the buffer and all of the data in the erase unit disappears together with management information. When the size of data to be rewritten is smaller than the erase unit, data which is not to be rewritten and is included in the erase unit also disappears. The operation power source is shut down by, for example, ejecting a memory card from a memory slot or shut-down of a battery power source of a card host. When a power source is shut down before a threshold voltage distribution by erasure is obtained during erasing operation, there is the possibility that part of nonvolatile memory cells remains in an over-erasure state (depleted). In the case of a memory array structure in which nonvolatile memory cells are connected in parallel to a bit line or source line, the nonvolatile memory cell in the over-erase state is on (normally on) even when unselected, so that current is always leaked from a bit line to a source line. When there is even one depleted nonvolatile memory cell in the nonvolatile memory cells sharing the bit line, an error occurs in a reading operation in all of the nonvolatile memory cells sharing the bit line.

The inventors herein have proposed a memory card having an erasable and writable flash memory and a card controller from the viewpoint of high-speed access and preventing destruction of write data caused by power shutdown during the writing process. According to the proposal, an erase table in which a vacant information flag is associated with each of physical addresses of a memory area is stored in a memory array of the flash memory. The vacant information flag indicates whether the corresponding memory area is in an erasable state or not. The card controller refers to the erase table in order to retrieve a memory area to which rewrite data is to be written. At the time of rewriting data, the card controller refers to the erase table. When the card controller identifies a vacant information flag indicative of the erasable state, the memory area (vacant block) of a physical address corresponding to the vacant information flag is set as a new memory area to which data is to be written. In short, in the writing process, new data is written in a vacant block and old data is held during the writing operation. After the writing operation, the block storing the old data is set as a vacant block. Consequently, even in the case where the power source is shut down during the writing process, since the old data is held, the data is not lost. According to the method, data is written in another memory area, so that it is necessary to dynamically manage the correspondence between a logical address and a physical address. An address conversion table as a table for managing the correspondence is recorded on a flash memory. As a table for managing the location of a vacant block, an erase table is also recorded on the flash memory and used for retrieving an erasable block at the time of the writing process. The address conversion table and the erasing table are updated every writing process.

The inventors herein have examined the prior art more specifically and have found the following points. Since the address conversion table and the erase table are recorded on the flash memory, there is a case that the data area cannot be sufficiently assured. When a depletion check is executed, it is necessary to check all of the areas of the flash memory. It is not realistic to execute the depletion check during a power-on resetting process.

An object of the invention is to provide a memory card having a reduced memory area necessary for holding a management information area.

Another object of the invention is to provide a memory card realizing suppression of a data loss before rewriting even when a power source is shut down during a stored information rewriting process.

Another object of the invention is to provide a memory card realizing reduction in time required for a depletion check.

The above and other objects and novel features of the invention will become apparent from the description of the specification and the appended drawings.

Outline of representative ones of the inventions disclosed in the specification will be briefly described as follows.

[1] A nonvolatile memory apparatus according to the invention has: an electrically rewritable nonvolatile memory; and a card controller for performing a memory control and an external interface control. The nonvolatile memory has a nonvolatile memory part having a plurality of memory cells. The nonvolatile memory part includes, as nonvolatile memory areas, a physical address area corresponding to a logical address and a save area used for saving data stored in the physical address area. In response to a data rewrite instruction on a required logical address, the card controller stores data in a predetermined physical address area corresponding to the logical address to the save area and rewrites the data stored in the physical address area. When rewriting of the physical address area is incomplete, the card controller performs a control of rewriting the data stored in the save area to the physical address area.

According to the invention, by storing data before rewriting into a save area, a failure caused by power shut-down or the like before completion of rewriting can be handled by writing the data from the save area. Thus, undesired data loss before rewriting caused by power shut-down during the rewriting process can be suppressed. Further, when power shut-down occurs during the rewriting process, the nonvolatile memory area having the possibility of depletion due to power shut-down is either the save area or the physical address area originally holding the data which is stored in the save area. The save area is not dynamically changed and a vacant area at that time is not dynamically assigned as the save area. Consequently, it is sufficient to make a depletion check in two areas of the save area and the physical address area specified by the data stored in the save area. Therefore, it does not take time for the process on the depletion. When a depletion occurs in the save area, the original data is stored in the physical address area originally storing the data to be saved in the save area.

The incomplete state of rewriting of the physical address area denotes depletion in the physical address area itself due to power shut-down. The incomplete state of rewriting of the physical address area denotes absence of valid write data in the physical address area. For example, the state is a state where information of the logical address assigned to the physical address area is not stored.

As a concrete mode of the invention, a table indicative of correspondence between a logical address and a physical address is stored in the nonvolatile memory area. Each of the physical address area and the save area has a data area and a management area for the data area, and the management area in the save area holds a logical address of data stored in the data area. In this case, in the rewriting process, the physical address corresponding to the logical address to be rewritten is obtained from the correspondence table, old data stored in the obtained physical address is saved in the save area and, after that, new data is written to the physical address. In a depletion check, first, the save area is checked. When no depletion occurs, the logical address of the save source held in the management area is obtained. With reference to the correspondence table, a physical address corresponding to the logical address information (ADR) is obtained and it is sufficient to make a depletion check on the physical address area.

As a further concrete mode of the invention, the management area also holds flag information (FLG) indicative of validity of data held in a corresponding data area.

As another concrete mode of the invention, the data rewriting is performed by an erasing process and a writing process on the nonvolatile memory area, each of the physical address area and the save area is divided in one or more units of an erasing process, which can be erased in a lump, the erasing process unit has a size which is multiple times as large a write data unit (512 bytes of one column), and the flag information has a plurality of bits capable of indicating validity of data on the write data unit basis.

When the write data size of rewriting is smaller than that of the erase processing unit in rewriting of the nonvolatile memory area, the card controller maintains the memory area in the nonvolatile memory area to which write data of rewriting is not given on the erase unit basis to be in the erase state and maintains data before rewriting in the memory area maintained in the erase state of the nonvolatile memory area to be valid in the save area.

With the configuration, at the time of performing a process of writing write data related to rewriting having a data size smaller than that of the erasing process unit to rewrite the nonvolatile memory area and, after that, rewriting another physical address area, it is sufficient for the card controller to perform a process of writing valid backup data already held in the save area and then store data of the next physical address.

As further another concrete mode of the invention, when validity of a predetermined physical address area corresponding to a required logical address cannot be confirmed in response to an instruction of reading data from the required logical address, the card controller checks that the data of the logical address is stored in the save area and outputs the data in the save area to the outside. Thus, occurrence of a data error in a reading operation prior to execution of a process of writing the data stored in the save area to the corresponding physical address area can be prevented.

As further another concrete mode of the invention, rewriting of data from the save area to the physical address area which is performed when rewriting of the physical address area is incomplete is enabled in response to either power-on reset or a result of execution of a depletion check command.

As further another concrete mode of the invention, when attention is paid to a nonvolatile memory having a so-called AG-AND memory array configuration, the nonvolatile memory has the plurality of nonvolatile memory parts (FARY0 to FARY3) and a plurality of volatile buffer parts (BMRY0 to BMRY3) corresponding to the nonvolatile memory parts, an erase unit of the nonvolatile memory part is multiple times of a write unit, and each of the volatile buffer parts has storage capacity of the write unit. The nonvolatile memory temporarily stores storage data in a physical address area to be rewritten into volatile buffer parts of both of a nonvolatile memory part to be rewritten and another nonvolatile memory part in response to a stored information rewriting operation instruction given from the card controller. At this time, the card controller performs a control of writing the data temporarily stored in the volatile buffer parts to save areas of nonvolatile memory parts corresponding to the volatile buffer parts.

[2] A nonvolatile memory apparatus according to another aspect of the invention includes: an electrically rewritable nonvolatile memory; and a card controller for performing a memory control and an external interface control. The nonvolatile memory has a nonvolatile memory part. The nonvolatile memory part includes, as nonvolatile memory areas, a physical address area corresponding to a logical address and a save area used for saving data stored in the physical address area. When validity of data stored in the save area is confirmed at a predetermined timing, the card controller determines validity of data held in a physical address area corresponding to data stored in the save area. When invalidity of the data is recognized, the card controller rewrites the data in the physical address area with the data stored in the save area.

According to the invention, by storing data before rewriting into a save area, a failure caused by power shut-down or the like before completion of rewriting can be handled by writing the data from the save area. Thus, undesired data loss before rewriting caused by power shut-down during the rewriting process can be suppressed. Further, when power shut-down occurs during the rewriting process, the nonvolatile memory area having the possibility of depletion due to power shut-down is either the save area or the physical address area originally holding the data which is stored in the save area. The save area is not dynamically changed and a vacant area at that time is not dynamically assigned as the save area. Consequently, it is sufficient to make a depletion check in two areas of the save area and the physical address area specified by the data stored in the save area.

As a concrete mode of the invention, the validity of data stored in the save area denotes absence of valid data stored in the save area. Rewriting of stored data from the save area to the physical address area which is performed when invalidity of data stored in the physical address area is recognized is enabled in response to either power-on reset or a result of execution of a depletion check command.

As another concrete mode of the invention, in response to an instruction of rewriting data of a required logical address, the card controller stores data in a predetermined physical address area corresponding to the logical address to the save area and rewrites the physical address area. At this time, a table indicative of correspondence between a logical address and a physical address is stored in the nonvolatile memory area. Each of the physical address area and the save area has a data area and a management area for the data area, and the management area in the save area holds a logical address of data stored in the data area. Desirably, the management area also holds flag information indicative of validity of data held in a corresponding data area.

As another concrete mode of the invention, the data rewriting is performed by an erasing process and a writing process on the nonvolatile memory area. Each of the physical address area and the save area is divided in one or more erasing process units, which can be erased in a lump, the erasing process unit has a size which is multiple times of a write data unit, and the flag information has a plurality of bits capable of indicating validity of data on the write data unit basis.

In the case of rewriting part of data written in one erasing process unit with rewrite data in the one erasing process unit in the physical address area corresponding to a logical address related to the data rewrite instruction, the card controller performs a control of writing the rewrite data in the one erase processing unit, maintaining the other part of the one erasing processing unit in an erase state, and maintaining the data stored in the save area in a valid state by the other part of the written data.

With the configuration, at the time of performing a process of writing write data related to rewriting having a data size smaller than that of the erasing process unit to rewrite the nonvolatile memory area and, after that, rewriting another physical address area, it is sufficient for the card controller to perform a process of writing valid backup data already held in the save area and then store data of the next physical address to the save area.

As further another concrete mode of the invention, when attention is paid to a nonvolatile memory having a so-called AG-AND memory array configuration, the nonvolatile memory has the plurality of nonvolatile memory parts and a plurality of volatile buffer parts corresponding to the nonvolatile memory parts, an erase unit of the nonvolatile memory part is multiple times of a write unit, and each of the volatile buffer parts has storage capacity of the write unit. The nonvolatile memory temporarily stores storage data in a physical address area to be rewritten into volatile buffer parts of both of a nonvolatile memory part to be rewritten and another nonvolatile memory part in response to a stored information rewriting operation instruction given from the card controller. At this time, the card controller performs a control of writing the data temporarily stored in the volatile buffer parts to save areas of nonvolatile memory parts corresponding to the volatile buffer parts.

Effects obtained by the representative ones of the inventions disclosed in the specification will be briefly described as follows.

Objects to be written in response to the data rewriting instruction are both the physical address area and the save area. When power shut-down occurs during writing of data to the save area, data remaining in the physical address area is used. When power shut-down occurs during writing of data to the physical address area, data remaining in the save area can be used. Thus, undesired data loss before rewriting due to power shut-down during the rewriting process can be suppressed.

In the case where power shut-down occurs during the rewriting process, the nonvolatile memory area having the possibility of depletion caused by power shut-down is either the save area or the physical address area in which the data stored in the save area has been originally stored. Since the save area is not dynamically changed and a vacant area at that time is not dynamically assigned as the save area. Consequently, it is sufficient to make a depletion check in two areas of the save area and the physical address area specified by the data stored in the save area. Therefore, time requested for a depletion check can be shortened.

The erase table for managing the location of a vacant block is not necessary in addition to the address conversion table. Thus, the memory area necessary for holding the information area for management can be reduced.

BRIEF DESCRIPTION OF THE DRAWINGS

FIG. 8 is an explanatory diagram showing an address conversion table defining correspondence between a logical address and a physical address.

FIG. 9 is an explanatory diagram illustrating a field configuration of a memory array of a flash memory.

FIG. 10 is an explanatory diagram illustrating concrete kinds of address information and flag information in a management area.

FIG. 13 is an explanatory diagram showing a state of the memory array when the physical address PA1 is erased in succession to FIG. 12.

FIG. 14 is an explanatory diagram showing a state of the memory array when the data D5 to D8 is written to the physical block of the physical address PA1 in succession to FIG. 13.

FIG. 17 is an explanatory diagram showing a state of the memory array when another data is already written in a logical address LA2 in the case of writing data D13 to D16 in a logical address LA2 in the state of FIG. 15.

FIG. 18 is an explanatory diagram showing a state of the memory array when data is additionally written in the column CL3 of the physical block PA1 corresponding to the logical address LA1 to which the data of the column CL3 of a save block of an address MA is saved in succession to FIG. 17.

FIG. 21 is an explanatory diagram showing a state of the memory array when the physical block of the physical address PA2 is erased in succession to FIG. 20.

FIG. 22 is an explanatory diagram showing a state of the memory array when the data D13 to D16 is written in the physical block of the physical address PA2 in succession to FIG. 21.

FIG. 26 is an explanatory diagram showing an address conversion table held on an AG-AND type flash memory 2.

FIG. 35 is an explanatory diagram showing a state of the memory array when valid data in a save block is rewritten to a corresponding physical block in a process of writing data C0 to C7 to logical addresses LA8 and LA9 (addresses of data other than data in the save block) in the state of FIG. 34.

FIG. 39 is an explanatory diagram showing a state of the memory array when data C0 to C7 are written to the high-order physical blocks (assigned to the logical addresses LA8 and LA9) of the physical addresses PA4 and PA5 in succession to FIG. 38.

FIG. 40 is an explanatory diagram showing a state of the memory array when data is additionally written in the case of writing data C8 to CF in the logical addresses LA8 and LA9 in succession to FIG. 39.

DETAILED DESCRIPTION OF PREFERRED EMBODIMENTS

Memory Card

Figure 1:
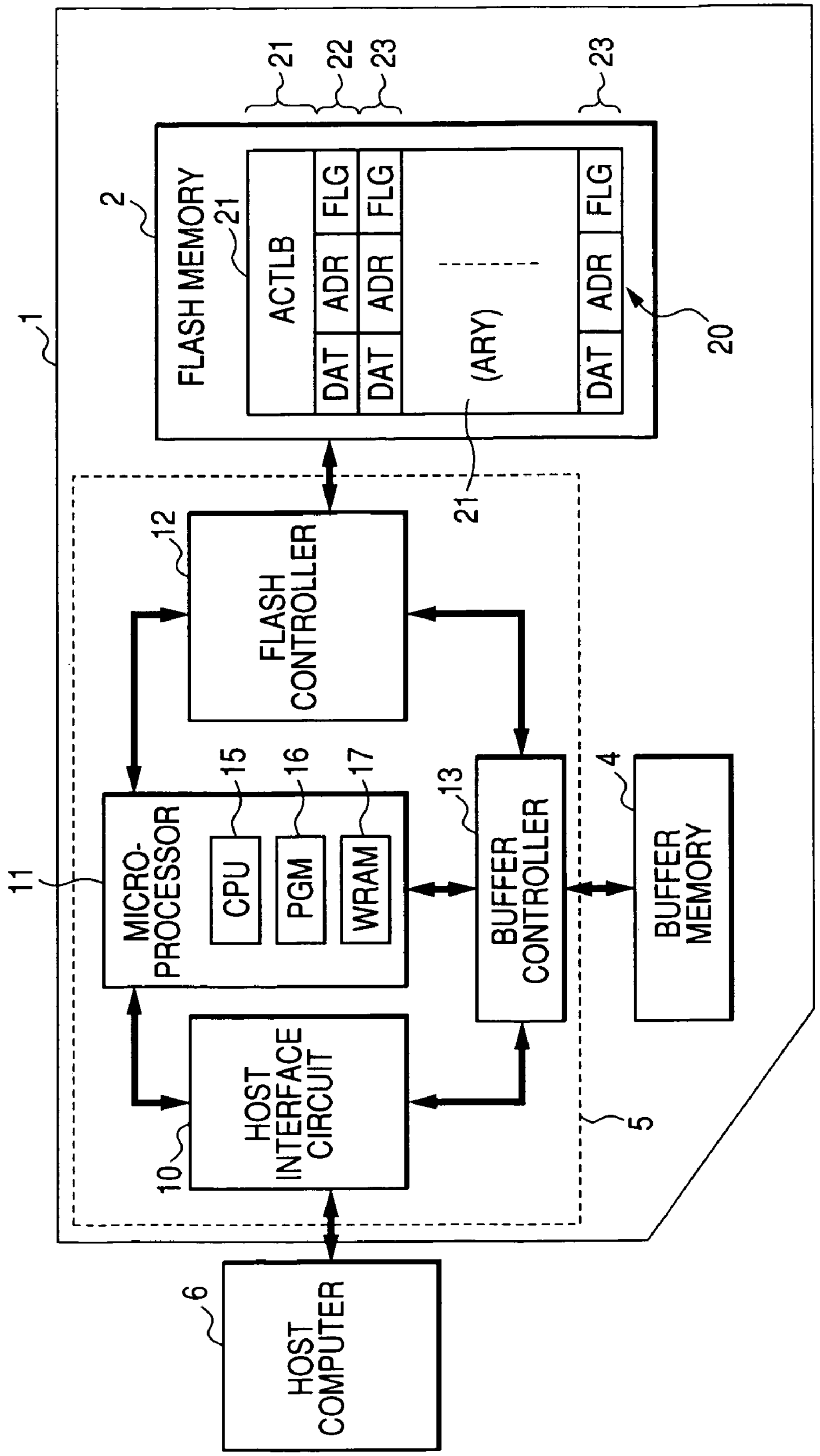
FIG. 1 is a block diagram showing an example of a memory card according to the invention.

FIG. 1 shows an example of a memory card according to the invention. A memory card 1 has, on a mounting board, an erasable and writable nonvolatile memory such as a flash memory 2, a buffer memory 4 taking the form of a DRAM (Dynamic Random Access Memory) or SRAM (Static Random Access Memory), and a card controller 5 for performing memory control and external interface control.

The buffer memory 4 and the flash memory 2 are subjected to an access control of the card controller 5. The flash memory 2 has, although not shown, a memory array ARY in which a number of electrically erasable and writable nonvolatile memory cell transistors are arranged in matrix. A memory cell transistor (also described as a flash memory cell) is constructed by, although not shown, a source and a drain formed in a semiconductor substrate or a well, a floating gate formed via a tunnel oxide film in a channel region between the source and the drain, and a control gate formed over the floating gate via an interlayer insulating film. The control gate is connected to a corresponding word line, the drain is connected to a corresponding bit line, and the source is connected to a source line. The threshold voltage of the memory cell transistor increases when electrons are injected to the floating gate, and decreases when electrodes are moved from the floating gate. The memory cell transistor stores information according to the threshold voltage relative to a word line voltage (voltage applied to the control gate) for reading data. Although not limited, in the specification, a process of decreasing the threshold voltage of the memory cell transistor will be called an erasing process and a process of increasing the threshold voltage will be called a writing process.

In FIG. 1, the card controller 5 is an external interface control with, for example, a host computer (host device) 6. The card controller 5 has an access control function of accessing the flash memory 2 in accordance with an instruction from the host computer 6. The access control function is a hard disk compatible control function. For example, when the host computer 6 manages a set of sector data as file data, the card controller 5 performs access control on the flash memory 2 by making a sector address as a logical address correspond to a physical memory address. In FIG. 1, the card controller 5 includes a host interface circuit 10, a microprocessor (MPU) 11 as computation control means, a flash controller 12, and a buffer controller 13. The flash controller 12 has a not-shown ECC circuit.

The MPU 11 has a CPU (Central Processing Unit) 15, a program memory (PGM) 16, a work RAM (WRAM) 17, and the like and controls the card controller 5 as a whole. The program memory 16 stores an operation program of the CPU 15 and the like.

The host interface circuit 10 is a circuit which interfaces with the host computer 6 such as a personal computer or workstation in accordance with a predetermined protocol such as ATA (ATAttachment), IDE (Integrated Device Electronics), SCSI (Small Computer System Interface), MMC (MultiMediaCard), or PCMCIA (Personal Computer Memory Card International Association). The host interface operation is controlled by the MPU 11.

The buffer controller 13 controls a memory access operation on the buffer memory 4 in accordance with an access instruction given from the MPU 11. Data input to the host interface 10 or data output from the host interface 10 is temporarily held in the buffer memory 4. Data read from the flash memory 2 or data to be written to the flash memory 2 is temporarily stored in the buffer memory 4.

The flash controller 12 controls reading operation, erasing operation, and writing operation on the flash memory 2 in accordance with an access instruction given from the MPU 11. The flash controller 12 outputs read control information such as a read command code and read address information in the reading operation, outputs write control information such as a write command code and write address information in the writing operation, and outputs erase control information such as an erase command in the erasing operation. The not-shown ECC circuit generates an error correction code for data to be written to the flash memory 2 in accordance with an instruction given from the MPU 11 and adds it to write data. The ECC circuit performs an error detecting and correcting process on data read from the flash memory 2 by using the error correction code added to the read data to correct an error in the error correctable range.

The flash memory 2 has, in a nonvolatile memory array (ARY) 20, an address conversion table (ACTLB) 21 as a table indicating correspondence between a logical address and a physical address, a save area (or save block) 22, and a plurality of physical address areas (or physical blocks) 23. The save area 22 and the physical address area 23 have the same field configuration including a data area DAT and a management area for the corresponding data area. The management area holds logical address information LA of data held in the corresponding data area and flag information FLG of a plurality of bits indicative of validity of the data held in the corresponding data area. The flag information FLG indicates validity/invalidity of the data area in the physical address area, and indicates a use/unuse state of the data area in the save area. A physical address MA in the save area 22 is fixed as long as the data retention characteristic of the area does not deteriorate. When the save area 22 becomes defective, a new physical address is assigned to the save area. The physical address of the save area is defined, although not limited, by using the last storage area in the address conversion table 21. Alternately, a specific storage area other than the address conversion table 21 in the memory array 20 may be used as the definition area.

Figure 2:
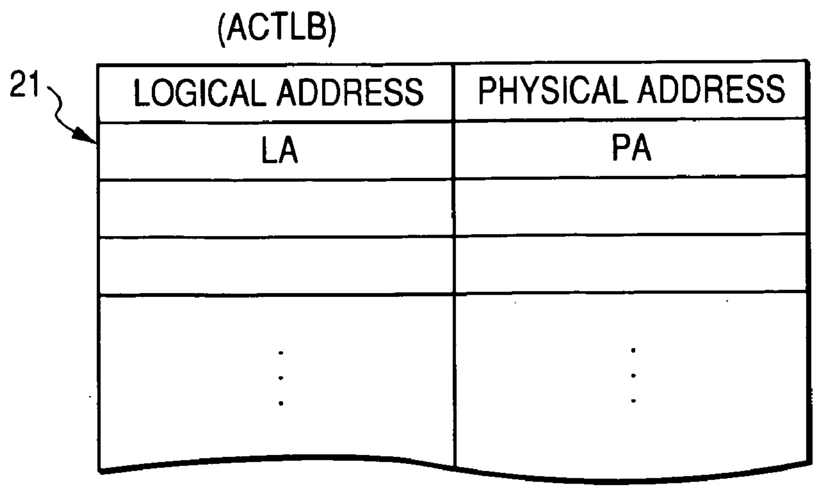
FIG. 2 is an explanatory diagram illustrating an address conversion table.

FIG. 2 illustrates the address conversion table 21. In the address conversion table 21, the logical address LA and the physical address PA are associated with each other. When a physical address becomes defective, a new physical address area is assigned to a logical address corresponding to the defective physical address area on the address conversion table 21, thereby updating the address table 21.

Figure 3:
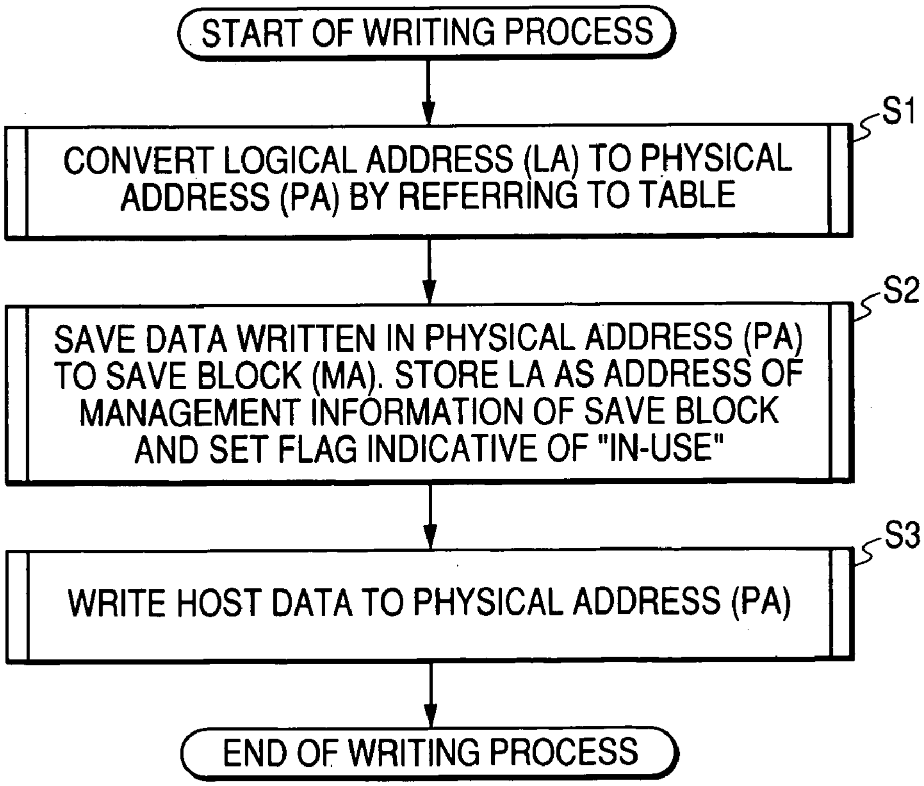
FIG. 3 is a flowchart showing a rewriting control procedure on a flash memory.
Figure 4:
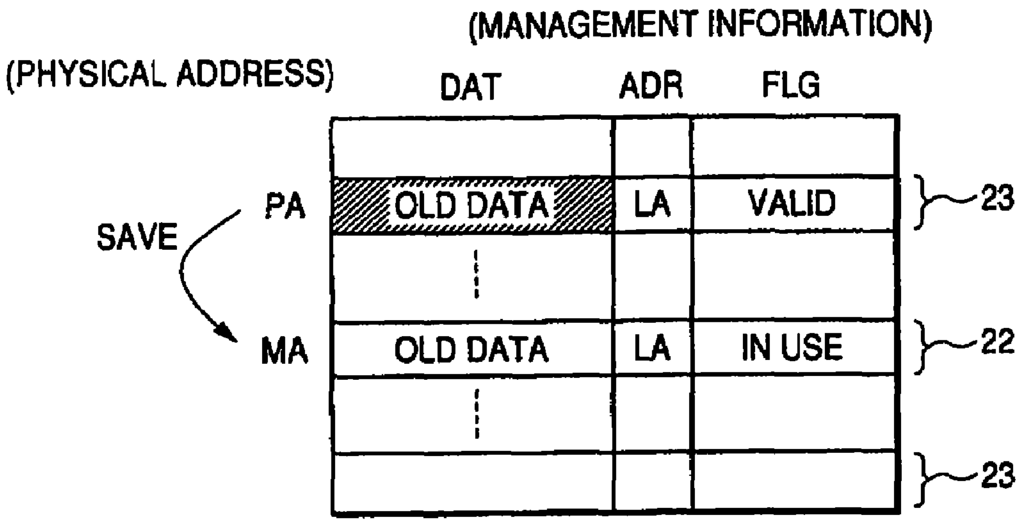
FIG. 4 is an explanatory diagram showing a state of data backup in the process of S2 in FIG. 3.
Figure 5:
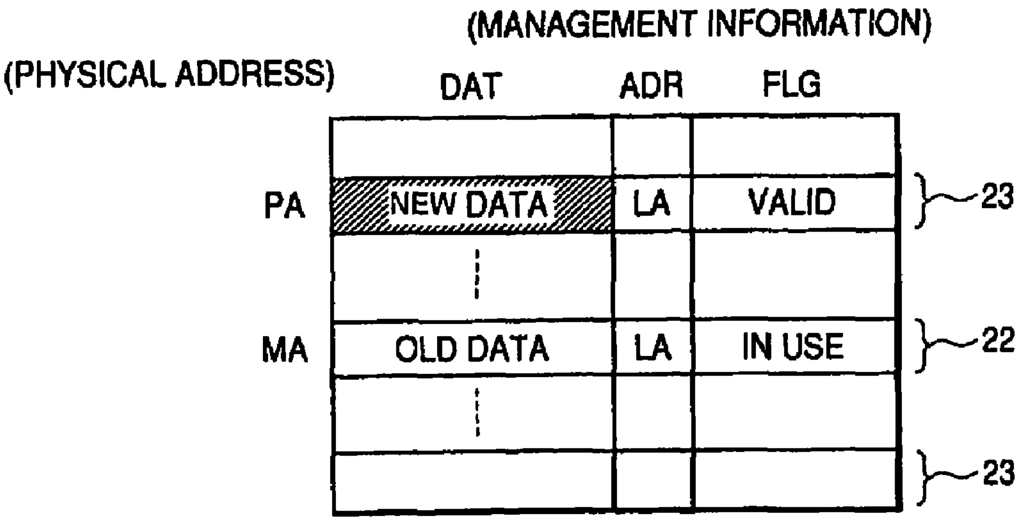
FIG. 5 is an explanatory diagram showing a state of data writing in the process of S3 in FIG. 3.

FIG. 3 illustrates a control procedure of rewriting the flash memory. In response to a data rewriting instruction designating a logical address received from the card host, first, the card controller 5 refers to the address conversion table 21 and obtains the physical address PA corresponding to the logical address LA (S1) Next, the card controller 5 reads the flash memory 2 by using the obtained physical address PA and stores the read data (old data) into the save area 22 of the physical address MA (S2). In the management area in the save area 22, the logical address LA corresponding to the physical address PA is stored, and the flag information FLG is changed from a code indicative of unuse to a code indicative of in-use. FIG. 4 shows a state of backup of the data in step S2. After that, the card controller erases the physical address area having the physical address PA and writes write data (new data) from the card host into the physical address area subjected to the erasing process (S3). In the management area, the logical address LA whose physical address area is assigned is written and a code of "valid" is written as flag information. FIG. 5 shows a state of the data writing process in step S3.

Figure 6:
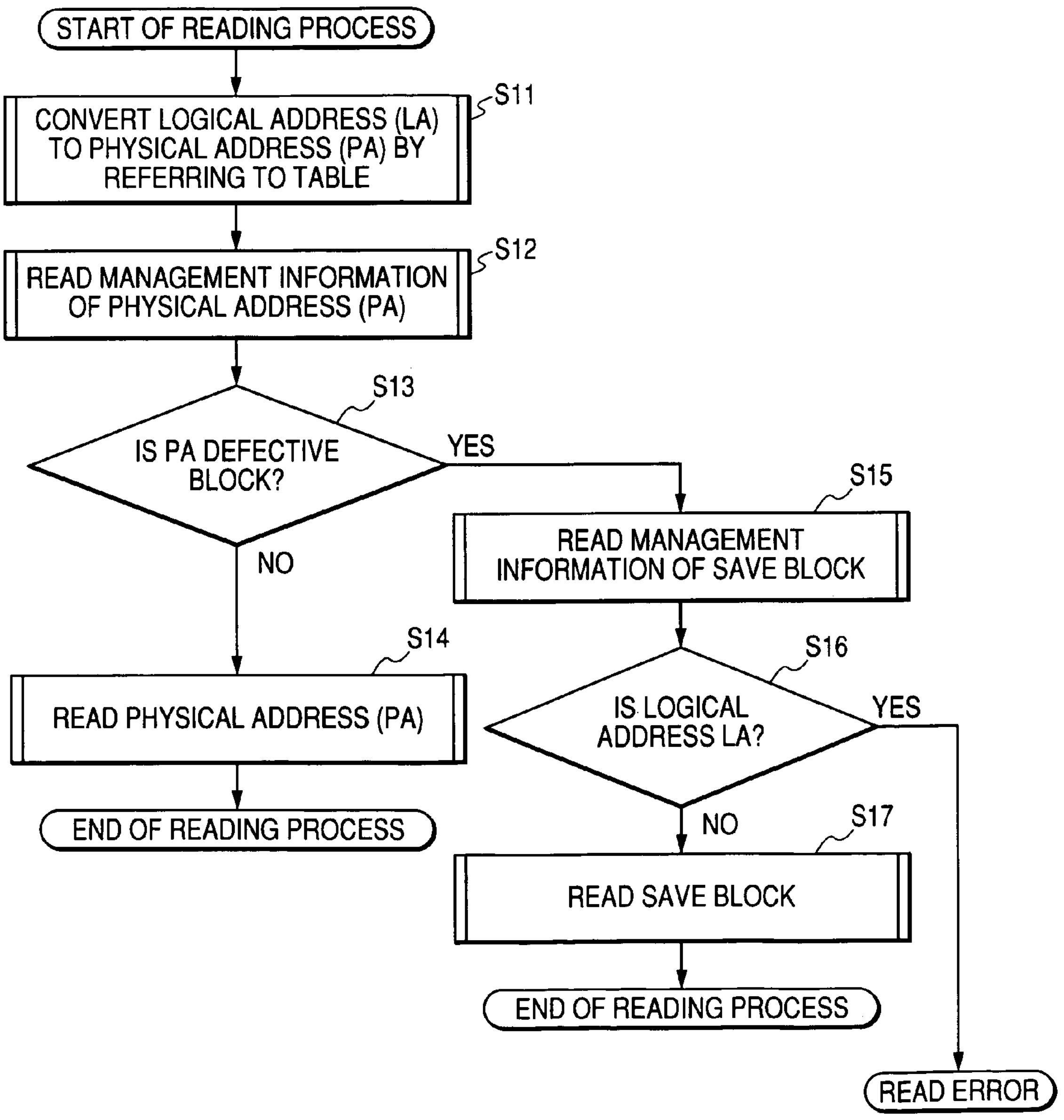
FIG. 6 is a flowchart illustrating a data reading control procedure on the flash memory.

FIG. 6 shows the control procedure of reading data from the flash memory. In the case of reading the logical address LA, first, the physical address PA corresponding to the logical address LA is obtained by referring to the address conversion table 21 of FIG. 2 (S11). Management information of the physical address PA is read (S12) and whether the physical address PA is a defective block or not is determined (S13). If NO, data is read from the physical block of the physical address PA (S14) and the reading process is finished. In the case where the physical address PA is a defective block in step S13, management information of the save block is read (S15) the saved logical address is obtained from the read management information and whether or not the address matches the logical address LA to be read is determined (S16). If the address matches the logical address LA, the save block is read (S17) and the reading process is finished. If the address does not match the logical address LA, it is regarded as a read error.

Figure 7:
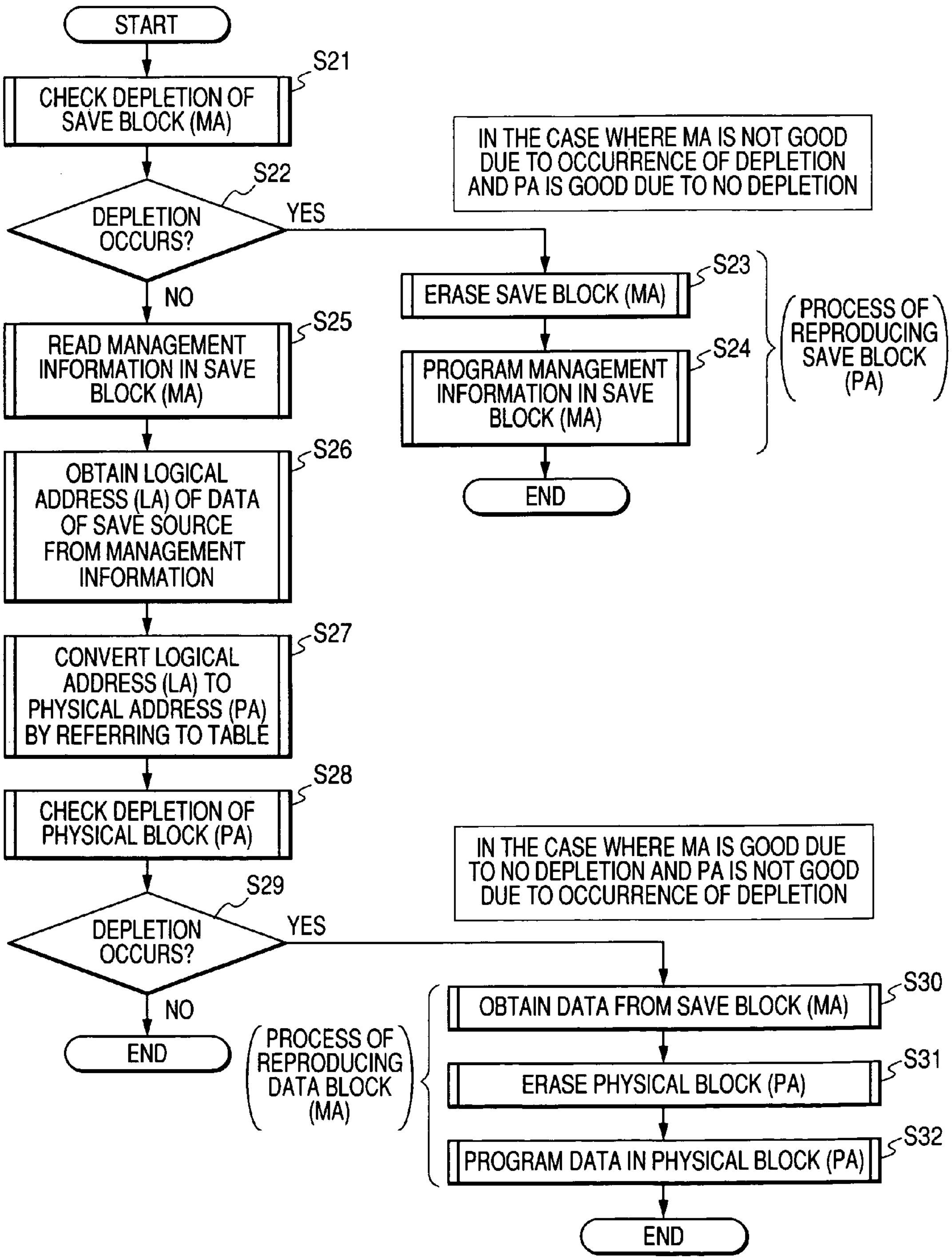
FIG. 7 is a flowchart illustrating a control procedure of a depletion check and rewriting.

FIG. 7 shows a control procedure of depletion check and rewriting. The process of FIG. 7 starts in response to cancellation of power-on reset or starts in response to a depletion check command supplied from the card host.

When a depletion check is instructed, first, a depletion check is made on the save block of the address MA (S21). The depletion check is made by a process of determining whether leak current occurs between the drain and the source or not when a flash memory cell is not selected. When depletion is found in step S22, the save block of the address MA is erased (S23), management information is generated in the save block of the address MA (S24), and the save block of the address MA is reproduced to a usable state. In short, the flag information FLG is set to the unuse state and address information ADR is set to be undefined. When the logical address of data stored in the save block is LA and depletion occurs in the save block having the address MA, there is no depletion in the physical block of the physical address PA corresponding to the logical address LA.

When there is no depletion in the save block having the address MA in step S22, management information of the save block is read (S25) and the logical address LA of the save block is obtained from the read management information (S26). By using the address conversion table 21, the corresponding physical address PA is obtained from the logical address LA (S27). A depletion check is made on the physical block of the obtained physical address PA (S28). When there is a depletion in step S29, data is obtained from the save block of the physical address MA (S30), the physical block of the physical address PA is erased (S31), and the data obtained from the save block of the physical address MA is written into the physical block of the physical address PA (S32)

In the memory card 1, objects to be written responding to the data rewriting instruction are both the physical block 23 and the save block 22. When power shut-down occurs during writing of data to the save block 22, data remaining in the physical block 23 is used. When power shut-down occurs during writing of data to the physical block 23, the data remaining in the save block 22 can be used. Consequently, undesired data loss before rewriting due to power shut-down during the rewriting process can be suppressed.

In the case where power shut-down occurs during the rewriting process, the nonvolatile storage area having the possibility of occurrence of depletion due to power shut-down is either the save block 22 or the physical block 23 originally storing the data which is backed up in the save block 22. Since the save block 22 is not dynamically changed and a vacant area is not dynamically assigned to the save block 22, it is sufficient to make the depletion check on the two blocks of the save block 22 and the physical block 23 specified by the backup data stored in the save block 22. The time required for the depletion check can be shortened.

Further, except for the address conversion table, the erase table managing the location of a vacant block is not required, so that the storage area necessary for holding information for management can be reduced.

Concrete Example using AND Type Flash Memory

Next, a rewriting operation performed in the case where a so-called AND-type flash memory is used as the flash memory 2 mounted on the memory card 1 will be concretely described. In the memory array of the AND-type flash memory, although not shown, control gates of nonvolatile memory cells arranged in a matrix on a memory block unit basis are connected to a word line in the X direction, the drains of the nonvolatile memory cells are connected to a sub bit line in the Y direction, the sources of the nonvolatile memory cells are commonly connected to a source line. The sub bit line is connected to a global bit line via a selection switch. The erase unit is equal to a memory block unit. The details of a so-called AND-type flash memory are disclosed in Japanese Unexamined Patent Publication No. Hei 11(1999)-232886.

In the flash memory 2, the address conversion table of the logical address and the physical address shown in FIG. 8 is held. The unit of the erase process and the write process of the AND-type flash memory 2 is 2112 bytes. In the memory array of the flash memory 2, as shown in FIG. 9, one physical block has storage capacity of 2112 bytes and is constructed by data areas of columns CL0 to CL3 each having 512 bytes and a management area of 32 bytes. In the management area, corresponding address information and flag information is stored. The physical block of the physical address MA is used as a save block.

FIG. 10 shows concrete kinds of the address information and the flag information of the management area. In the data area of the physical block, the flag information FLG is assigned to the columns CL0 to CL3. "F000" indicates that the column CL0 is valid. "0F00" denotes that the column CL1 is valid. "00F0" denotes that the column CL2 is valid. "000F" denotes that the column CL3 is valid. Therefore, when data of the CL0 and CL1 is valid and data of the CL2 and CL3 is invalid, the flag information is "FF00". In the data area of the save block, the flag information FLG is not assigned to each of the columns CL0 to CL3. As the whole data area, "0000" denotes unuse, "FF00" denotes in-use, and "FFFF" denotes used. The other information is ignored.

FIG. 9 shows the state of the memory array before data is written. In the management area in the physical block of the physical address PA1, information of the logical address LA1 and the flag "0000" is recorded.

Figure 11:
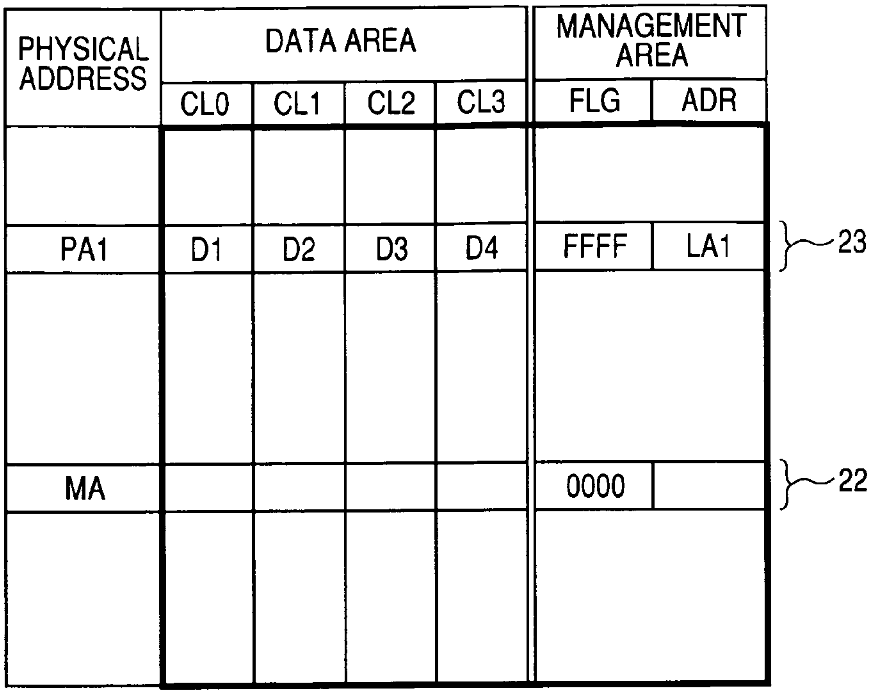
FIG. 11 is an explanatory diagram showing a state of the memory array when data D1 to D4 is additionally written to a physical address PA1 corresponding to a logical address LA1 in an operation of writing the data D1 to D4 to the logical address LA1 in the state of FIG. 9.

In the case of writing data D1 to D4 of "512 bytes×4" to the logical address LA1 in the state of FIG. 9, as shown in FIG. 11, the data D1 to D4 and the flag information "FFFF" is additionally written to the physical address PA1 corresponding to the logical address LA1.

Figure 12:
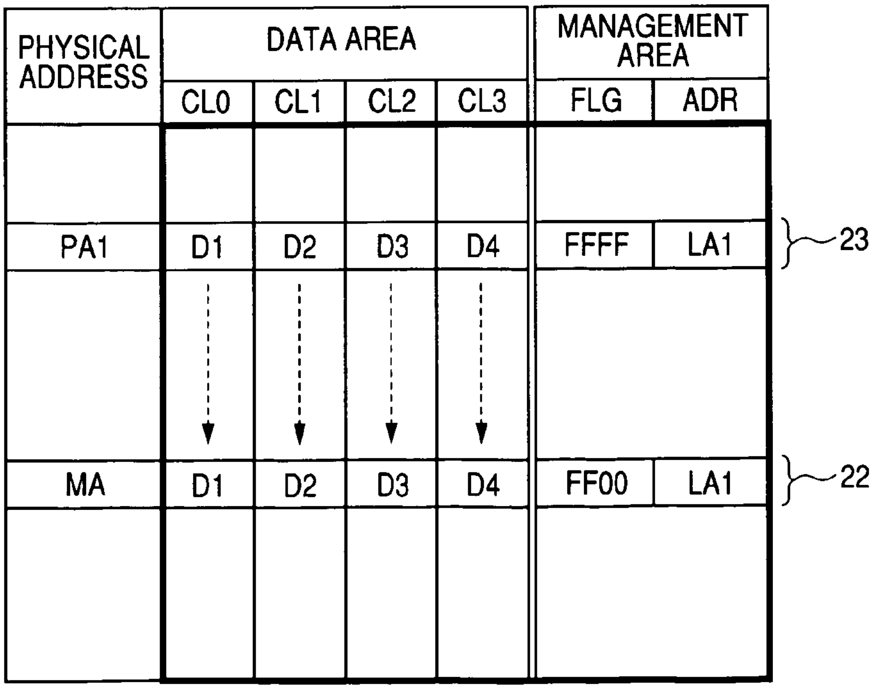
FIG. 12 is an explanatory diagram showing a state of the memory array when the data D1 to D4 in the physical address PA1 corresponding to the logical address LA1 is written into a save block for the first time in the operation of writing data D5 to D8 to the logical address LA1 in the state of FIG. 11.

FIGS. 12 to 14 show the operations performed in the case of writing data D5 to D8 of "512 bytes×4" to the logical address LA1 in the state of FIG. 11. First, as shown in FIG. 12, the data D1 to D4 of the physical address PA1 corresponding to the logical address LA1 is saved in the save block 22 of the physical address MA. As the management information in the save block 22, the flag information of "FF00" (in-use) and the address LA1 is set. After that, as shown in FIG. 13, the data in the physical address PA1 is erased. Finally, as shown in FIG. 14, the data D5 to D8, flag information of "FFFF" (all of columns are valid) and the address information LA1 is written in the physical block 23 of the physical address PA1. The flag information of the save block 22 is set to "FFFF" (used).

Figure 15:
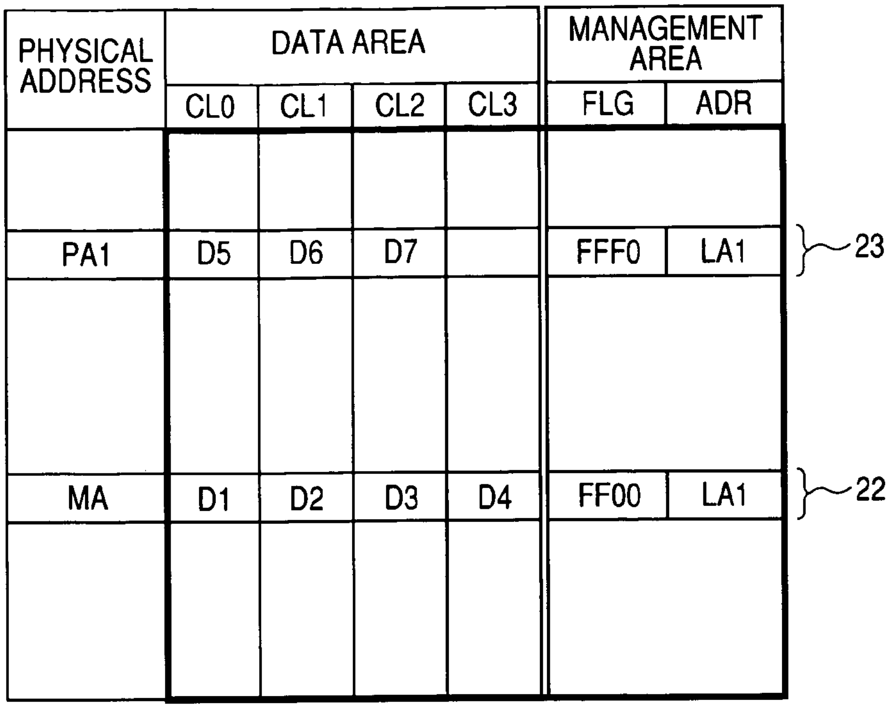
FIG. 15 is an explanatory diagram showing a state of the memory array when the data D5 to D7 and management information is written subsequent to FIGS. 12 and 13 in the case of writing the data D5 to D7 to the logical address LA1 in the state of FIG. 11.

In the case of writing the data D5 to D7 of "512 bytes×3" to the physical block 23 of the logical address LA1 in the state of FIG. 11, the operations of FIGS. 12 and 13 are performed and, after that, the operation of FIG. 15 is performed. Specifically, in FIG. 15, the data D5 to D7 is written to the physical block 23 of the physical address PA1, the flag information of the management information is set to "FFF0", and the columns CL0 to CL2 are validated. The flag information "FF00" in the save block 22 of the address MA remains. When a reading process is performed in this state, it can be determined from the flag information in the management area in the physical block 23 of the physical address PA1 that the valid data exists in the columns CL0 to CL2. With respect to the data in the invalid column CL3, the data in the column CL3 in the save block 22 of the address MA is read in accordance with the flowchart of FIG. 6.

Figure 16:
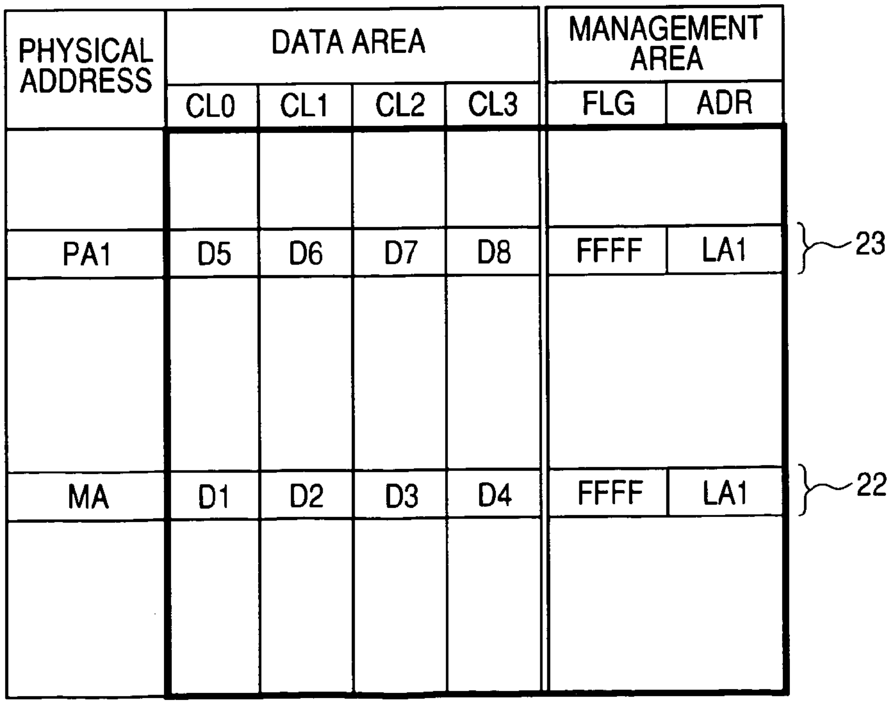
FIG. 16 is an explanatory diagram showing a state of the memory array when data is additionally written to a column CL3 of the physical address PA1 in the case of writing data to the column CL3 of the logical address LA1 in the state of FIG. 15.

In the case of writing data to the column CL3 in the physical block 23 corresponding to the logical address LA1 in the state of FIG. 15, as shown in FIG. 16, data is additionally written to the column CL3 in the physical address PA1, the flag information of the management area is set to "FFFF" and the data D8 of the column CL3 is validated. It is sufficient to change the flag information in the management area in the save block 22 to "FFFF" indicative of the "used state".

Figure 19:
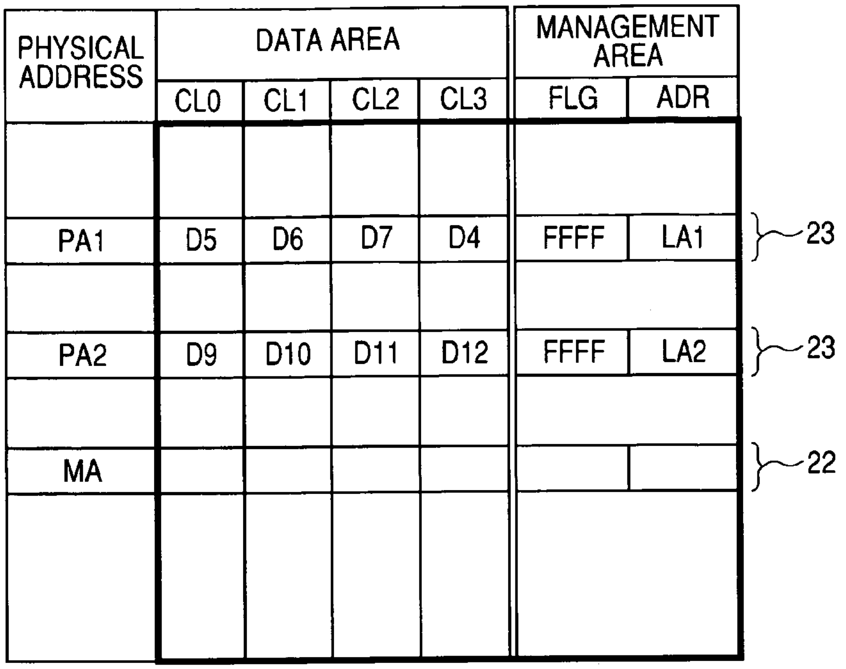
FIG. 19 is an explanatory diagram showing a state of the memory array when the save block of the address MA is erased in succession to FIG. 18.
Figure 20:
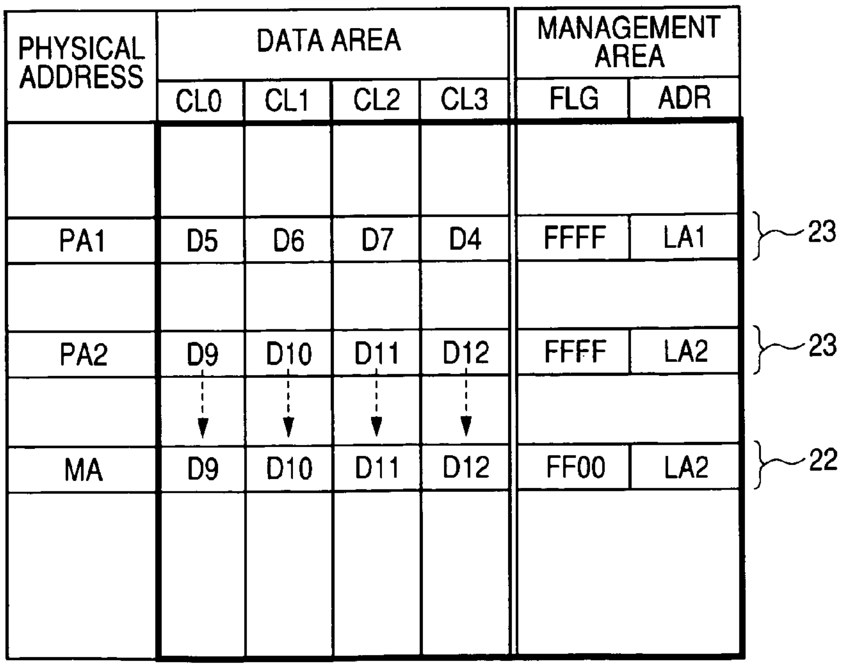
FIG. 20 is an explanatory diagram showing a state of the memory array when data D9 to D12 of the physical address PA2 is written in a save block 22 of the address MA in succession to FIG. 19.

FIGS. 17 to 22 show operations performed in the case of writing data D13 to D16 of "512 bytes×4" to the logical address LA2 in the state of FIG. 15. It is assumed that, as shown in FIG. 17, data D9 to D12 is already written in the physical address PA2 corresponding to the logical address LA2. First, shown in FIG. 18, the data in the column CL3 in the save block 22 of the address MA is additionally written to the column CL3 in the physical block 23 of PA1 corresponding to the logical address LA1 as a destination. Next, as shown in FIG. 19, the save block 22 of the address MA is erased. After that, as shown in FIG. 20, the data D9 to D12 of the physical address PA2 is written to the save block 22 of the address MA. The flag information in the management area is set to "FF00" (in-use) and the address information is set as LA2. After that, as shown in FIG. 21, the physical block 23 of the physical address PA2 is erased. Finally, as shown in FIG. 22, data D13 to D16 is written into the physical block 23 of the physical address PA2. The flag information of the physical block is set to "FFFF". As the flag information in the save block 22 of the address MA, "FFFF" indicative of "used" is additionally written.

Concrete Example using AG-AND type Flash Memory

Figure 23:
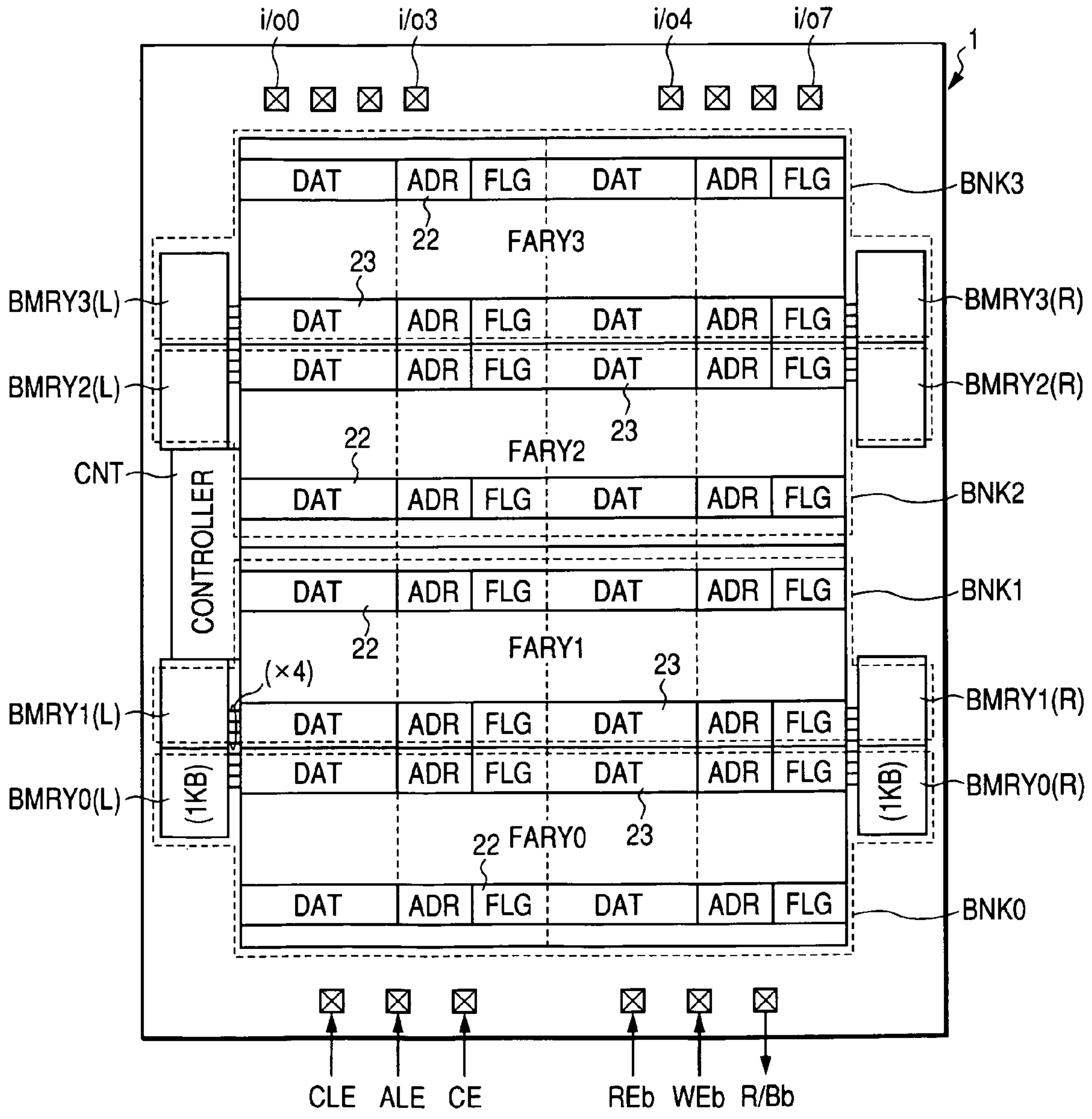
FIG. 23 is a plan view showing the schematic configuration of an AG-AND type flash memory.

A rewriting operation performed in the case of using a so-called AG-AND type flash memory as a flash memory mounted on a memory card will be concretely described. A memory array in the AG-AND type flash memory has, although not shown, a configuration that neighboring two sub bit lines used for a memory array in an AND-type flash memory are combined to one sub bit line and an erase unit is set to be twice as large as a write unit. The details of the so-called AG-AND type flash memory are described in International Publication WO 03/073431. The details of the configuration of a memory mat will be described here. FIG. 23 is a plan view showing a schematic configuration of the AG-AND type flash memory.

The flash memory 2 shown in FIG. 23 has, for example, four memory banks BNK0 to BNK3 and a controller CNT. The memory banks BNK0 to BNK3 have flash memory arrays FARY0 to FARY3 as nonvolatile memories, and buffer memories BMRY0 to BMRY3 as volatile buffers, respectively. The buffer memories are disposed on the right and left sides of one flash memory array. For convenience, the suffix (R) is attached for the buffer memories on the right side and the suffix (L) is attached for the buffer memories on the left side.

External input/output terminals i/o0 to i/o7 of the flash memory 1 serve as address input terminals, data input terminals, data output terminals, and command input terminals. The flash memory 1 receives external access control signals such as a command latch enable signal CLE. The controller CNT controls the signal interface function with the outside in accordance with the state of the access control signal and also controls the internal operations in accordance with an input command. The four memory banks BNK0 to BNK3 can operate in parallel.

Each of the flash memory arrays FARY0 to FARY3 has a number of nonvolatile memory cells arranged in a matrix. Although not limited, one nonvolatile memory cell is constructed by a known floating gate type transistor. For example, a nonvolatile memory cell is constructed by a source and a drain formed in a well region, a floating gate formed via a tunnel oxide film in a channel region between the source and the drain, and a control gate formed over the floating gate via an interlayer insulating film. The control gate is connected to a word line, the drain is connected to a bit line, and the source is connected to a source line.

In the AG-AND type flash memory 2, one physical block has storage capacity of 4,224 bytes, the write unit is 2,112 bytes which is the half of 4,224 bytes, and the erase unit is 4,224 bytes. Each of the upper half and the lower half of one physical block is constructed by a data area DAT of four columns each having 512 bytes and a management area of 32 bytes (logical address information ADR and flag information FLG). In one physical block, a high-order logical address and a low-order logical address are provided.

The save block 22 is assigned to a specific physical address in each of the memory banks BNK0 to BNK3. The function of the save block is the same as that in an AND-type flash memory.

The buffer memories BMRY0 to BMRY3 take the form of, for example, SRAMs (Static Random Access Memories) temporarily hold storage data read from the flash memory arrays FARY0 to FARY3 and temporarily hold data to be written to the flash memory arrays FARY0 to FARY3. The storage capacity of each of the buffer memories BMRY0 to BMRY3 provided for the memory banks is 2,112 bytes which is equal to the writing process unit. The buffer memories BMRY0 to BMRY3 are divided to the right and left sides of the memory banks. The storage capacity of the divided one buffer memory is 1,056 bytes.

Figure 24:
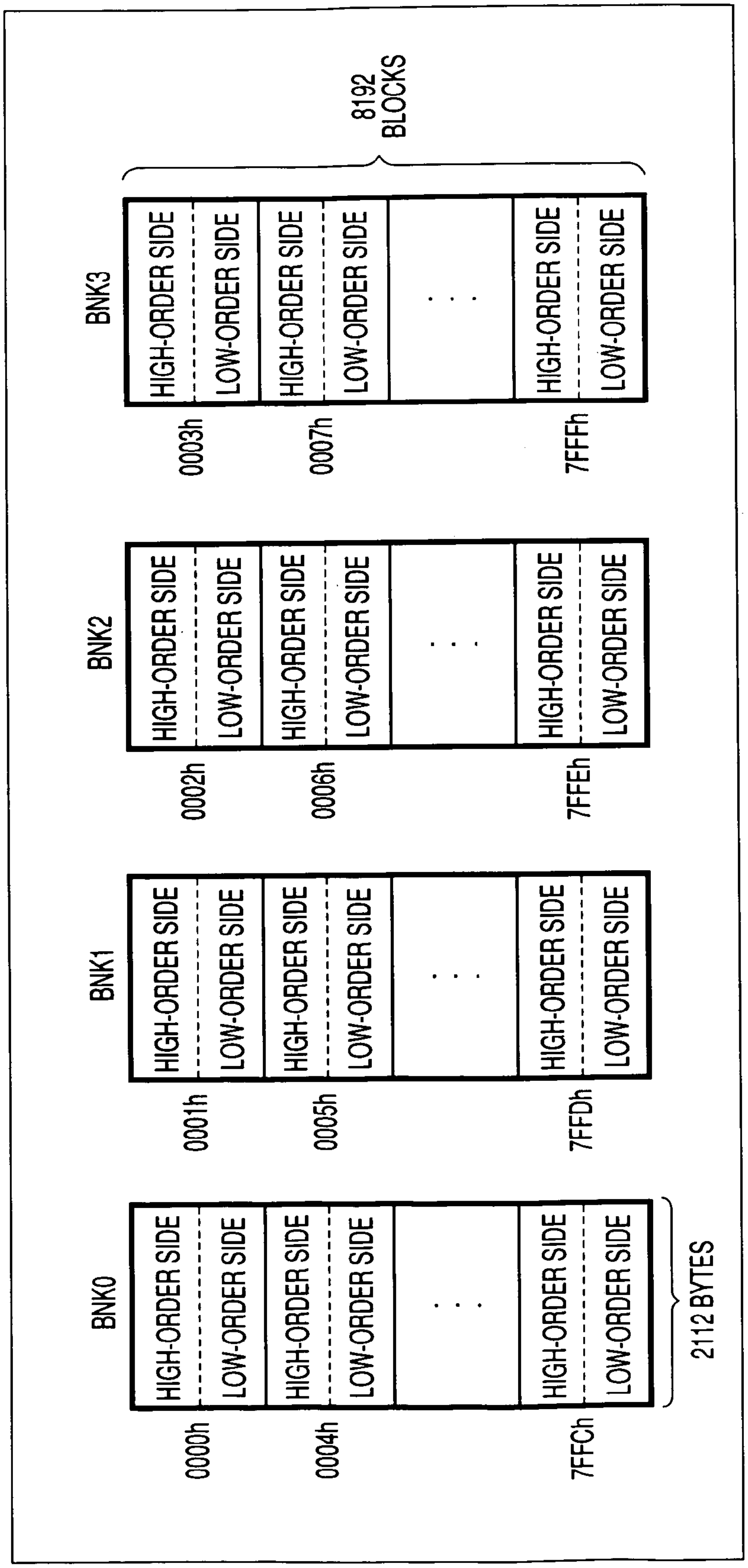
FIG. 24 is an explanatory diagram illustrating the configuration of memory banks and physical blocks of the AG-AND type flash memory.

FIG. 24 illustrates the configuration of the memory banks and the physical blocks of the AG-AND flash memory. As described above, the AG-AND type flash memory 2 has four memory banks. One memory bank includes erase blocks which are 8,192 physical blocks. The erase blocks are constructed in two write units.

Figure 25:
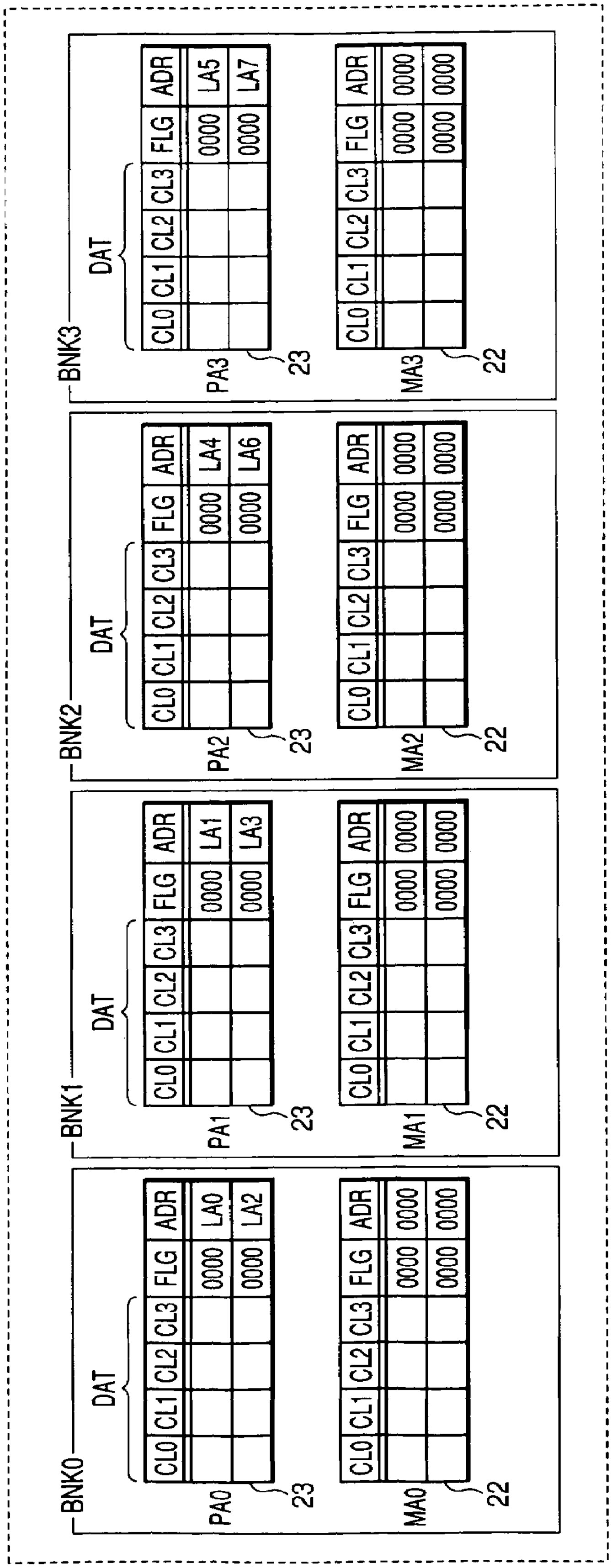
FIG. 25 is an explanatory diagram showing one physical block 23 and one save block 22 in each of memory banks BNK0 to BNK3 of the AG-AND type flash memory.

FIG. 25 shows one physical block 23 and the save block 22 in each of the memory banks BNK0 to BNK3 of the AG-AND flash memory. The physical blocks of the physical addresses PA0 to PA3 and the save blocks of the physical addresses MA0 to MA3 are shown. As described above, each of the physical blocks and the save blocks is equal to the erase unit, the write unit is half of the erase unit, and a logical address is assigned on the write unit basis. Specifically, FIG. 25 shows an initial state before data is written, in which the data area DAT is in an erase state, the logical addressees LA0 to LA7 are stored as the address information ADR in the management area, and logical addresses are assigned in such a manner that the logical address LA0 is assigned on the high-order side of the write unit of PA0, the logical address LA2 is assigned on the low-order side of the write unit of PA0, the logical address LA1 is assigned on the high-order side of the write unit of PA1, and the logical address LA3 is assigned on the low-order side of the write unit of PA1. Physical addresses MA0 to MA3 are fixed physical addresses assigned to save blocks and have the size of the erase unit. The data area DAT is a collection of four columns CL0 to CL3 each having 512 bytes in a manner similar to the above. The physical address assigned to a save block is changed when an error occurs in the storage area.

Each of the physical blocks and the save blocks has management information on the write unit basis. As the management information, the flag information FLG and the logical address information ADR is recorded. The flag information FLG and the address information ADR is the same as that shown in FIG. 10. In a physical block, a logical address corresponding to a physical address is written. In a save block, the logical address of saved data is written.

FIG. 26 shows an address conversion table stored in the AG-AND type flash memory 2. Physical addresses corresponding to logical addresses are assigned so that continuous logical addresses are not assigned to one physical block as described above for the following reason. Since the storage capacity of each of the buffer memories BMRY0 to BMRY3 is equal to the write unit and the memory banks BNK0 to BNK3 can operation in parallel with each other, by the assignment, the writing and reading operations on the continuous logical addressees can be performed at high speed.

Figure 27:
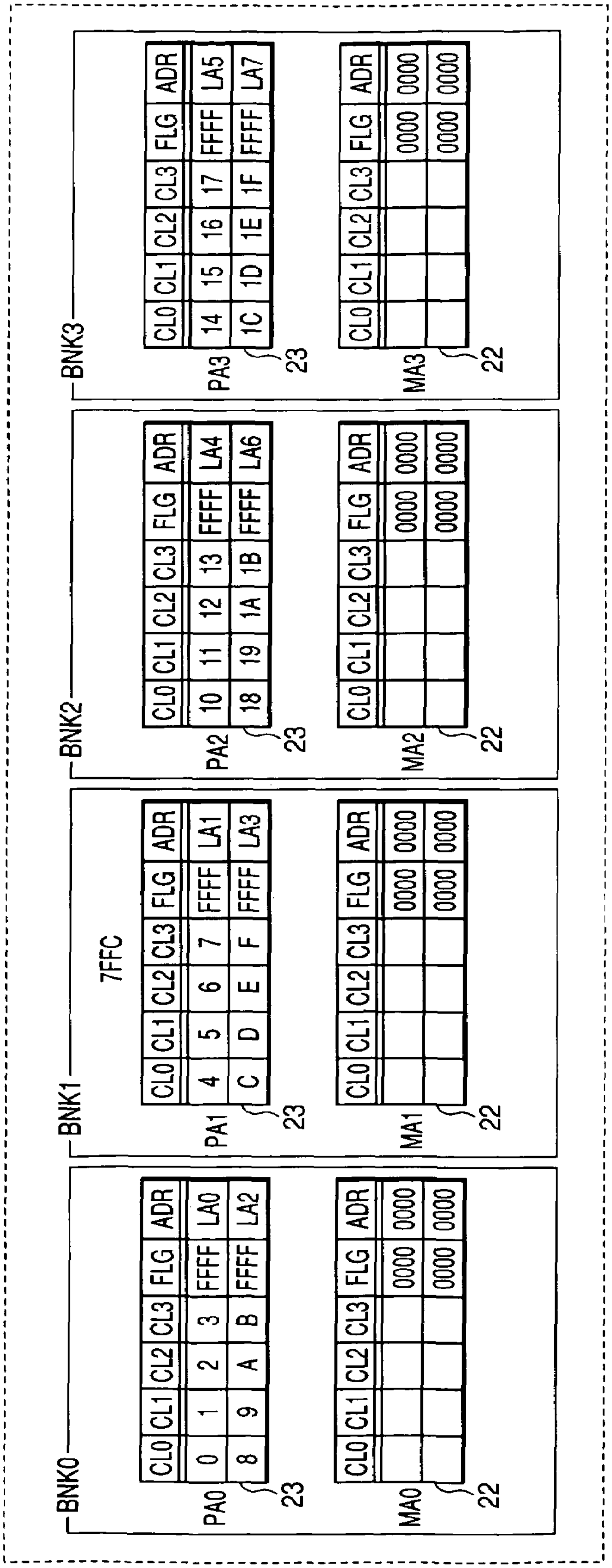
FIG. 27 is an explanatory diagram showing a state of the memory array when data is written to physical blocks of the physical addresses PA0 to PA3 corresponding to logical addresses LA0 to LA7 in the state of FIG. 25.

FIG. 27 shows a state where data is written in the physical blocks of the physical addresses PA0 to PA3 corresponding to the logical addresses LA0 to LA7 in the state of FIG. 25. Since valid data is written, "FFFF" is recorded as the flag FLG in the management information.

Figure 28:
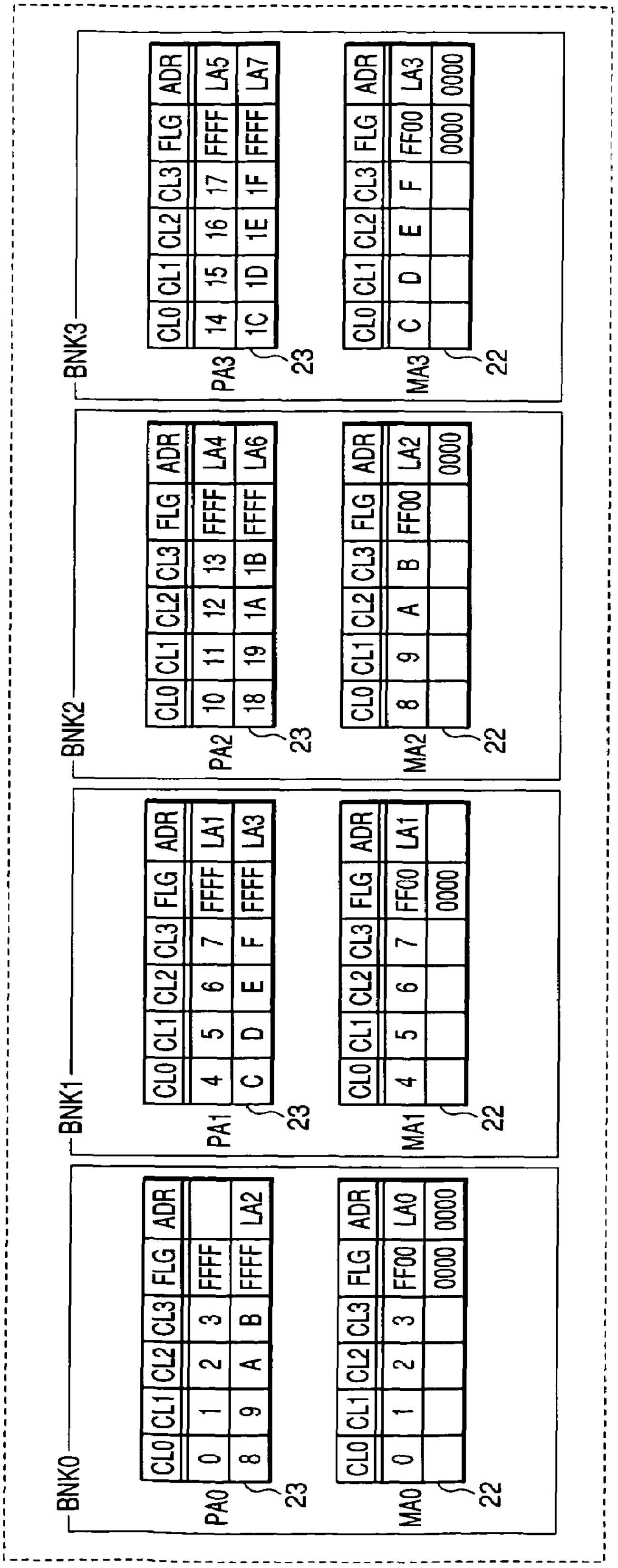
FIG. 28 is an explanatory diagram showing a state of the memory array when data is saved in save blocks in the physical blocks PA0 and PA1 for the first time in the operation of writing data A0 and A1 in high-order columns CL0 and CL1 in the write unit of the physical block PA0 of the logical address LA0 in the state of FIG. 27.
Figure 29:
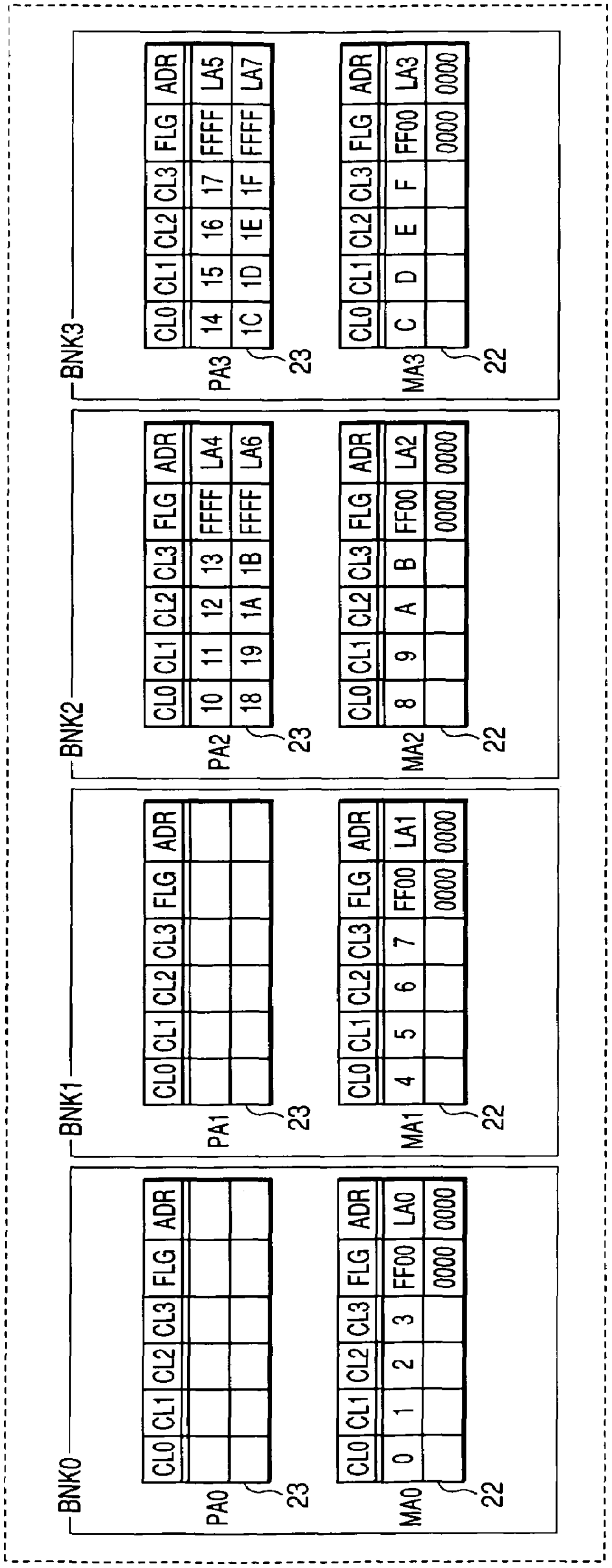
FIG. 29 is an explanatory diagram showing a state of the memory array when erasure is performed on the physical blocks of the physical addresses PA0 and PA1 in succession to FIG. 28.
Figure 30:
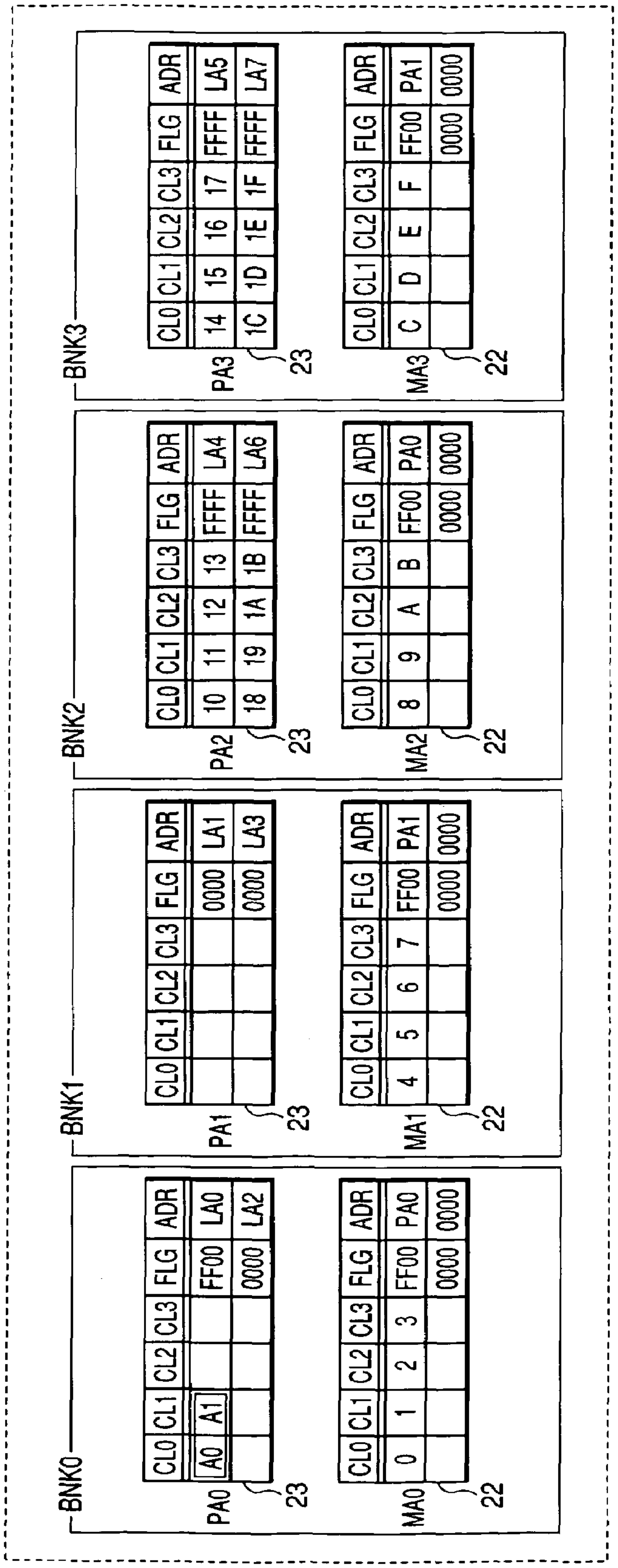
FIG. 30 is an explanatory diagram showing a state of the memory array when the data A0 and A1 is written in the high order columns in the write unit in the physical block corresponding to the logical address LA0 in succession to FIG. 29.

FIGS. 28 to 30 show processes of writing data A0 and A1 in the columns CL0 and CL1 of the high-order in the write unit of the physical block PA0 to which the logical address LA0 is assigned in the state of FIG. 27. First, as shown in FIG. 28, data 0 to 3 in the high-order in the write unit in the physical block of PA0 is saved to the high order in the write unit in the save block of MA0, data 8 to B in the low order in the write unit in the physical block of PA0 is saved to the high order in the write unit in the save block of MA2, data 4 to 7 in the high order in the write unit in the physical block of PA1 is saved to the high order in the write unit in the save block MA1, and data C to F in the low order in the write unit in the physical block PA1 is saved to the save block of MA3. The reason why only the high-order side of each of the save blocks MA0 to MA3 is used is to save data at once by using the parallel writing operation of the memory banks BNK0 to BNK3. LA0, LA1, LA2, and LA3 are written as the address information ADR in the management area in the save block, and "FF00" is written as the flag information FLG. In FIG. 29, the physical blocks of the physical addresses PA0 and PA1 are erased. In FIG. 30, the data A0 and A1 is written to the columns CL0 and CL1 in the high order of the write unit in the physical block of the physical address PA0 corresponding to the logical address LA0. In the management area in the high order of the write unit of PA0, the logical address information LA0 and the flag information "FF00" is written. In the management area of the high order of the write unit of PA1, the logical address information LA1 and the flag information "0000" is written.

In the reading process, as described by referring to FIG. 6, whether data to be read exists in a save block or not is determined. In FIG. 30, the data of LA0 is recorded in both of the save block of MA0 and the physical block of PA0. A column in which a valid flag is set in a physical block is read from the physical block PA0. A column in which an invalid flag is set in a physical block is read from the save block MA0. Since the flag of the physical block PA1 is an invalid flag, as data in LA1 and LA3, data in all of the columns CL0 to CL3 is read from the save block MA0.

Figure 31:
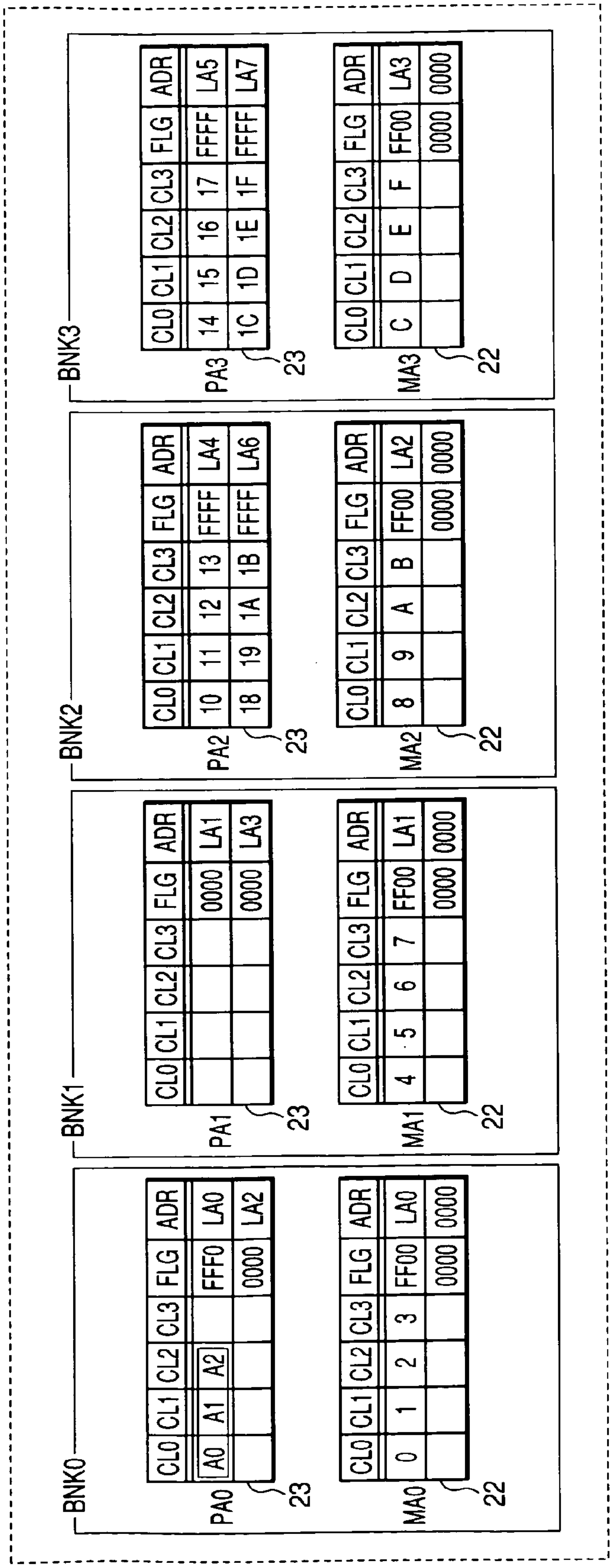
FIG. 31 is an explanatory diagram showing a state of the memory array when data is additionally written in the case of writing data A2 into a column CL2 of the logical address LA0 in succession to FIG. 30.

In the case of writing data A2 into the column CL2 in the logical address LA0 in the state of FIG. 30, since data is already saved and the column CL2 in the logical address LA0 is in the erased state, as shown in FIG. 31, it is sufficient to additionally write data and additionally write "F" in the flag of the column CL2 in the logical address LA0.

Figure 32:
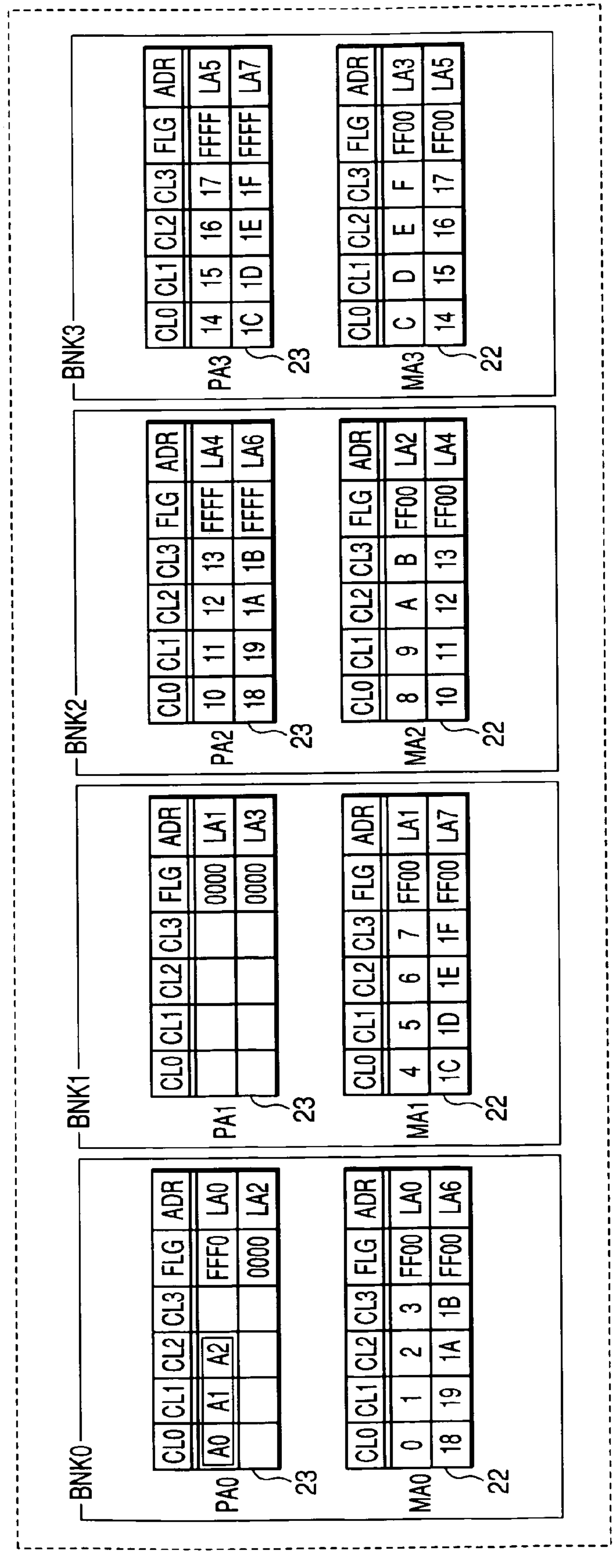
FIG. 32 is an explanatory diagram showing a state of the memory array when data of logical addresses LA4 to LA7 (PA2 and PA3) is written to the low-order side of save blocks MA0 to MA3 for the first time in the process of writing data B5, B6, and B7 to the columns CL1 to CL3 of the logical address LA5 in the state of FIG. 31.
Figure 33:
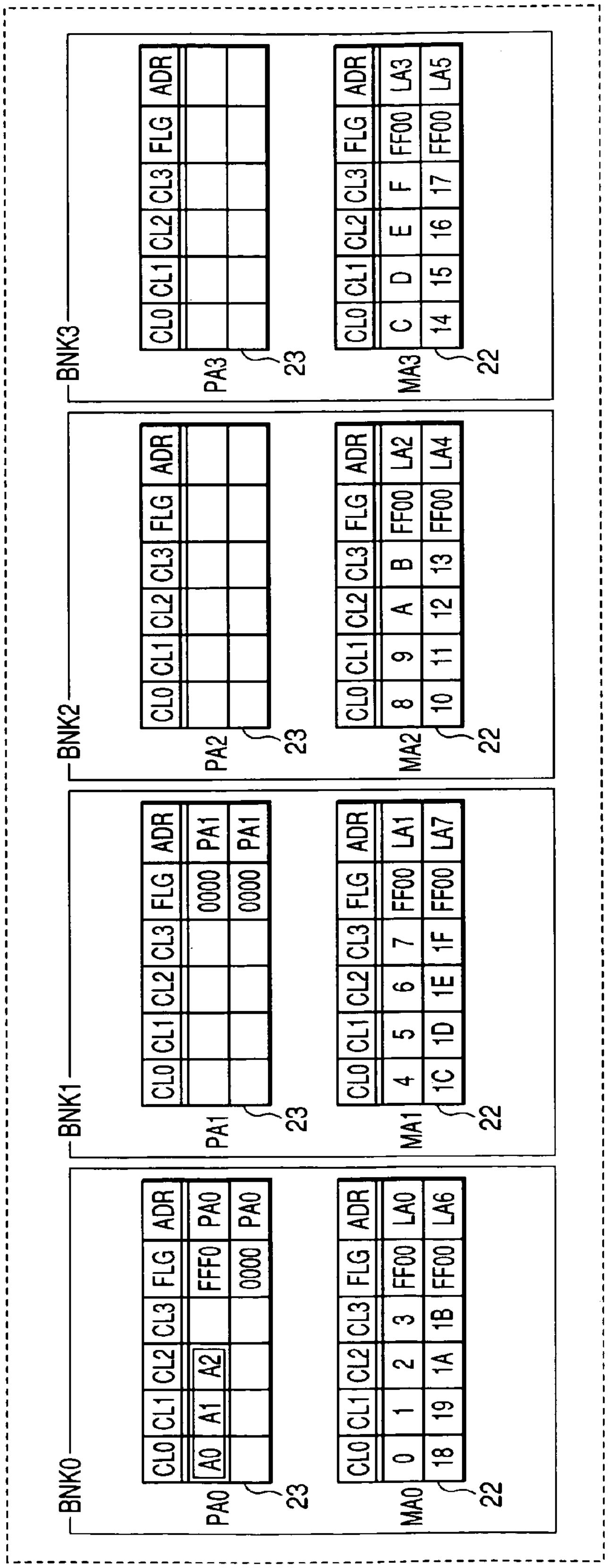
FIG. 33 is an explanatory diagram showing a state of the memory array when the physical blocks of PA2 and PA3 are erased in succession to FIG. 32.
Figure 34:
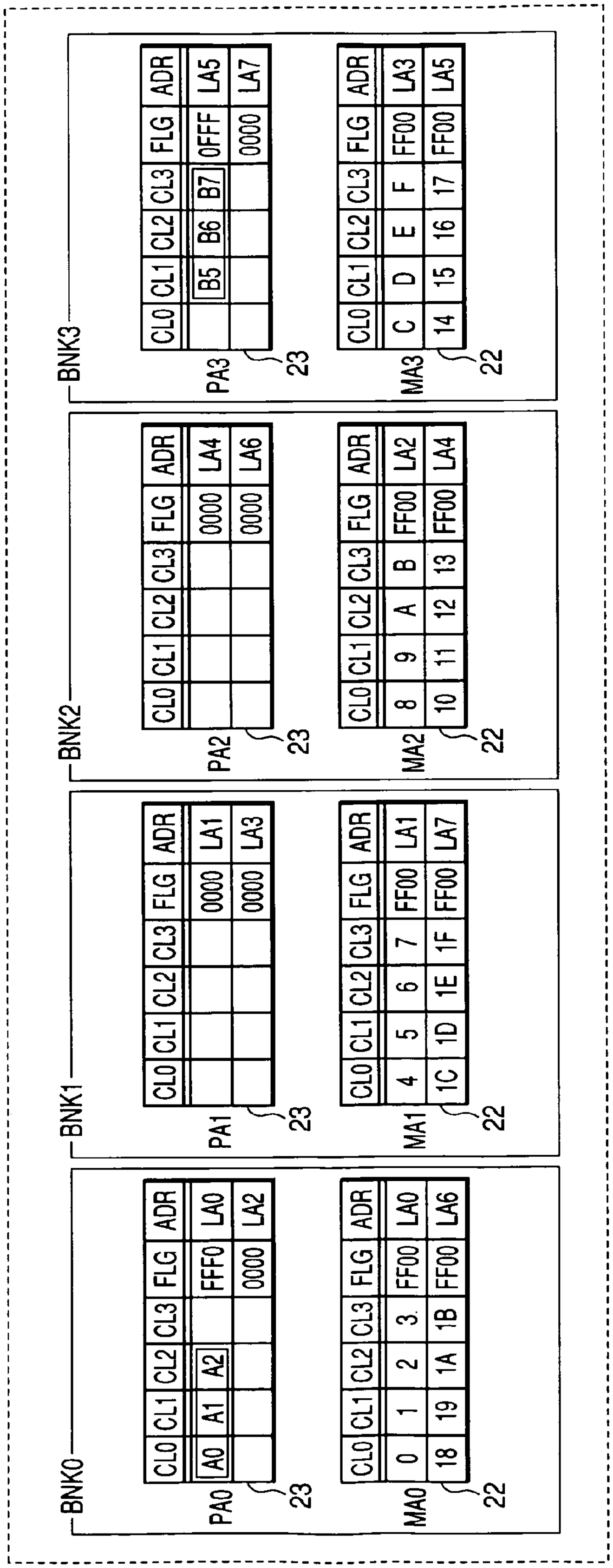
FIG. 34 is an explanatory diagram showing a state of the memory array when data B5, B6, and B7 is written to the columns CL1 to CL3 of the logical address LA5 in succession to FIG. 33.

FIGS. 32 to 34 show a process of the operation of writing data B5, B6, and B7 to the columns CL1 to CL3 of the logical address LA5 in the state of FIG. 31. In FIG. 32, data in the logical addresses LA4 to LA7 (PA2, PA3) is written to the low-order side of the save blocks MA0 to MA3. As address information in the management area on the low-order side of the save blocks MA0 to MA3, LA4 to LA7 are written and "FF00" indicative of "in-use" is written as the flag information. In FIG. 33, the physical blocks of PA2 and PA3 are erased. In FIG. 34, data B5, B6, and B7 is written in the columns CL1 to CL3 of the physical address LA5. As flag information in the management area of the high order side of the physical block of PA3, "F" is written in correspondence with the columns CL1 to CL3 and "0" is written in the others.

Figure 36:
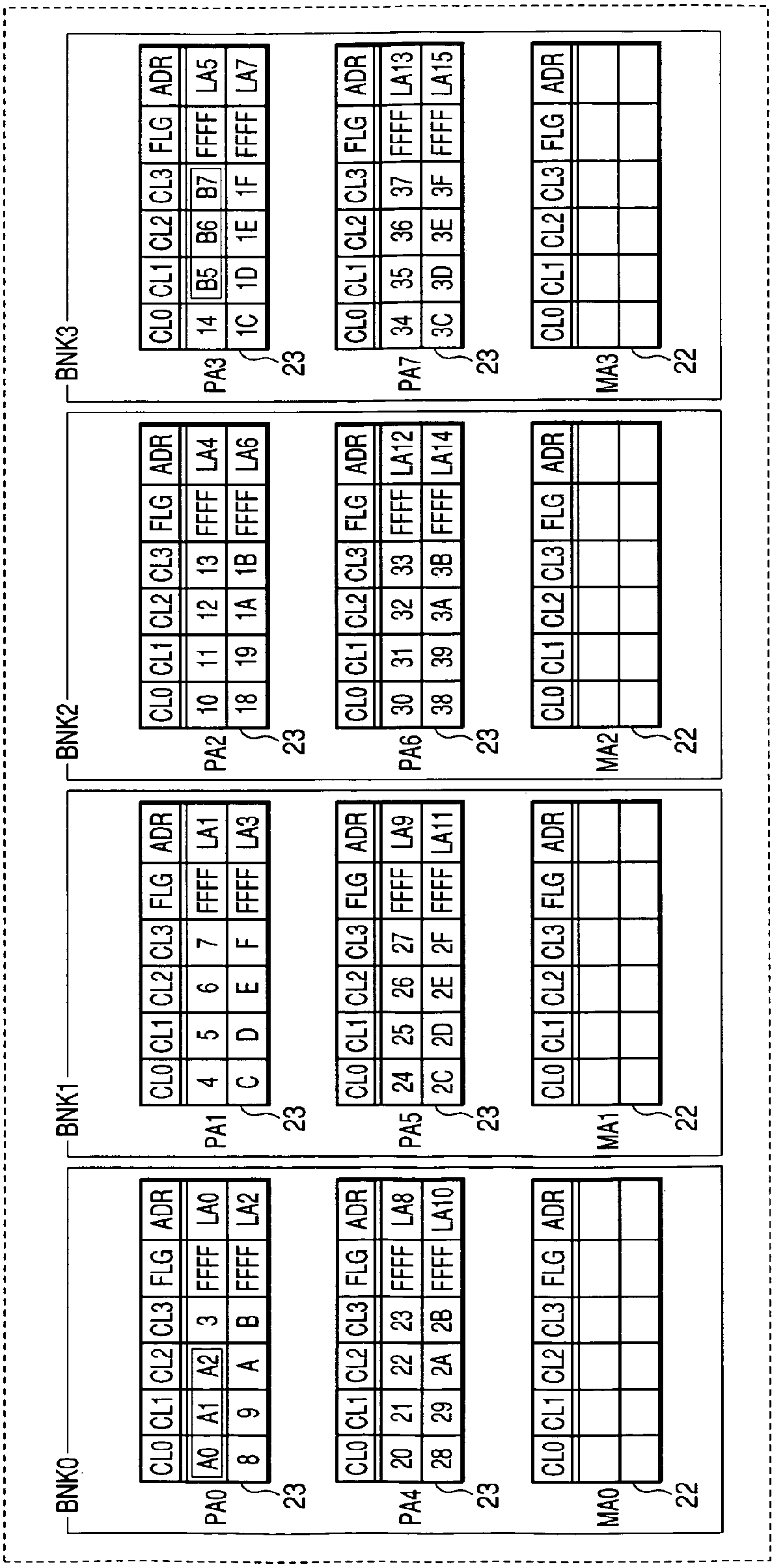
FIG. 36 is an explanatory diagram showing a state of the memory array when save blocks MA0 to MA3 are erased in succession to FIG. 35.
Figure 37:
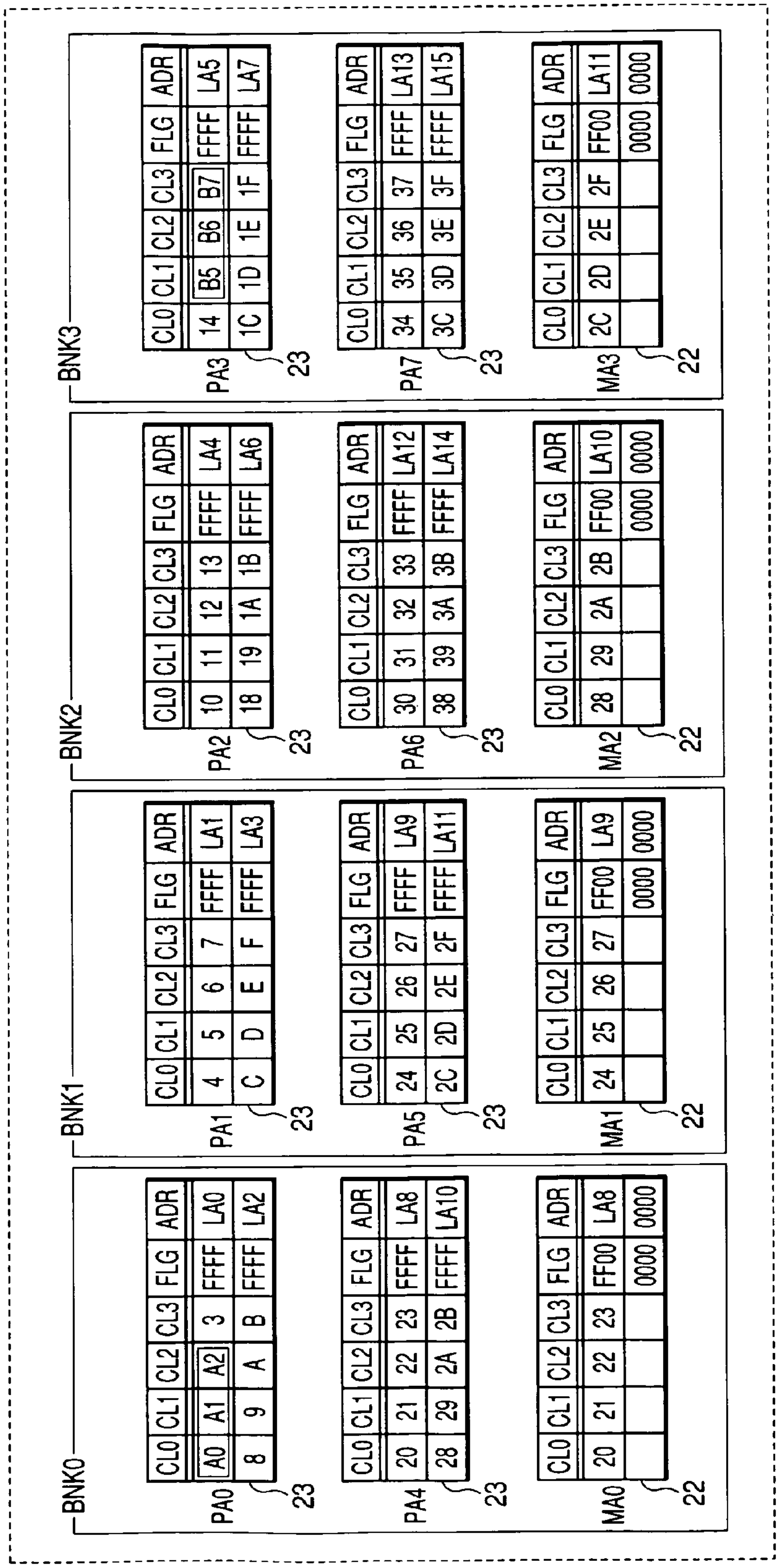
FIG. 37 is an explanatory diagram showing a state of the memory array when the physical blocks of the physical addresses PA4 and PA5 corresponding to the logical addresses LA8 to LA11 are saved to the high-order side of the save blocks MA0 to MA3 in succession to FIG. 36.
Figure 38:
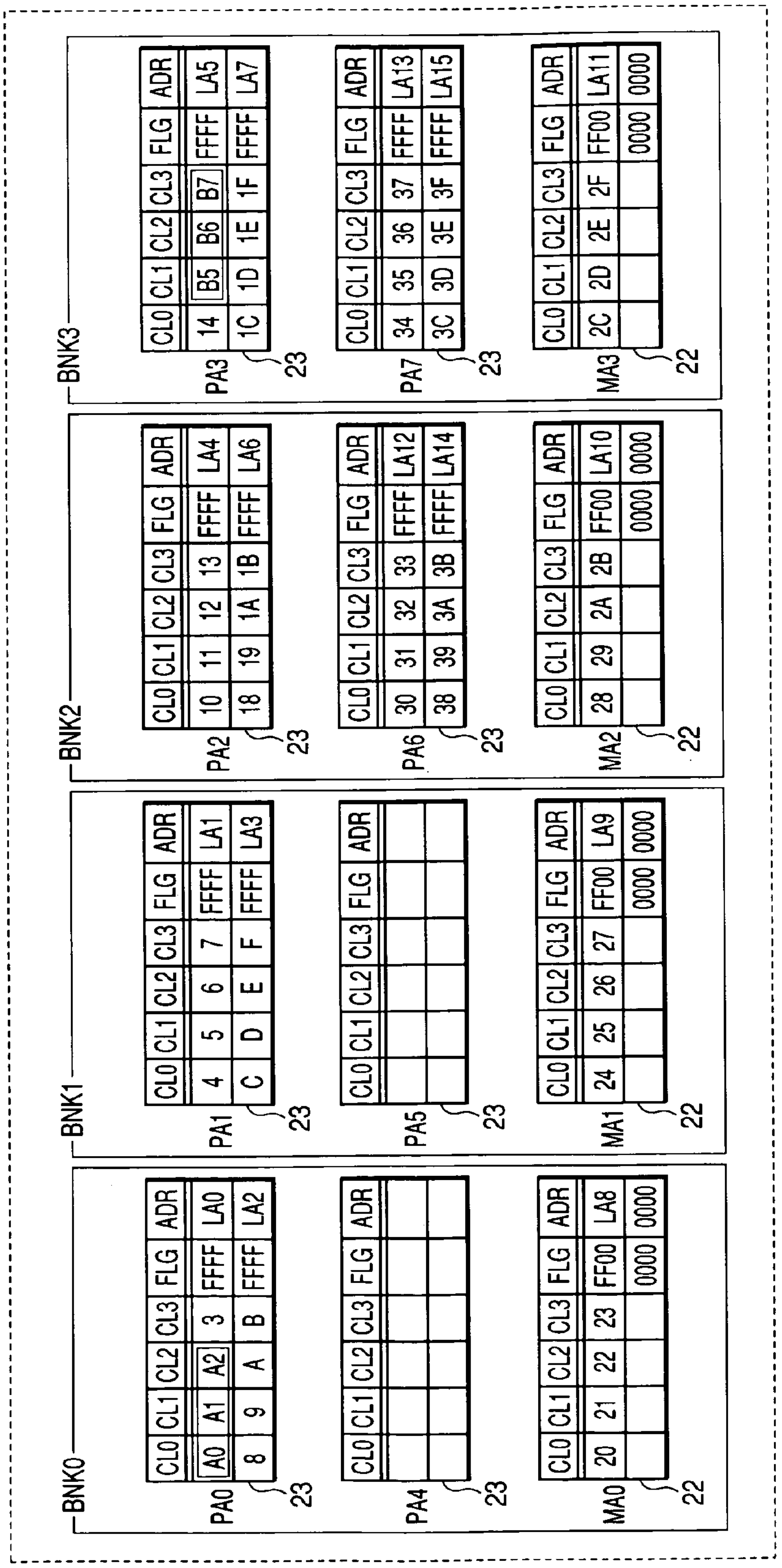
FIG. 38 is an explanatory diagram showing a state of the memory array when the physical blocks of the physical addresses PA4 and PA5 are erased in succession to FIG. 37.

FIGS. 35 to 39 show the process of writing data C0 to C7 to logical addresses LA8 and LA9 (addresses of data other than the data in the save blocks) in the state of FIG. 34. In FIG. 35, valid data in the save blocks in the state of FIG. 34, specifically, data in the column CL3 in the logical address LA0 and data in the logical addresses LA1 to LA3 is rewritten to the corresponding physical blocks. Whether a save block is valid or not is determined by the flag of the physical block. In FIG. 36, the save blocks MA0 to MA3 are erased. In FIG. 37, the physical blocks of the physical addresses PA4 and PA5 corresponding to the logical addresses LA8 to LA11 are saved to the high order side of the save blocks MA0 to MA3. LA8 to LA11 are written as the address information of the management area of the save blocks MA0 to MA3, and "FF00" indicative of "in-use" is written as flag information. In FIG. 38, the physical blocks of the physical addresses PA4 and PA5 are erased. In FIG. 39, data C0 to C7 is written to the high-order physical blocks (assigned to the logical addresses LA8 and LA9) of the physical addresses PA4 and PA5. In the management areas corresponding to the logical addresses LA8 and LA9, "FFFF" is written as flag information. In the management areas corresponding to the logical addresses LA10 and LA11, "0000" is written as flag information. Since valid data disappears on the high order side of the save blocks MA0 and MA1, the flag information "FFFF" indicative of "used" is written in the corresponding management areas.

In the case of writing data C8 to CF in the logical addresses LA8 and LA9 in the state of FIG. 39, since data is already saved and the logical addresses LA8 and LA9 are in the erased state, as shown in FIG. 40, data is additionally written and the flag information "FFFF" is additionally written in correspondence with the logical addresses LA8 and LA9.

Although the invention achieved by the inventors herein has been concretely described above on the basis of the embodiment, obviously, the invention can be variously modified without departing from the gist.

For example, the sizes of the physical block and save blocks, meaning of the flag information, and the like can be properly changed. In addition, the bank configuration of the memory array is also changeable. On the memory card according to the invention, a security controller typified by an IC card microcomputer may be also mounted. The invention is not limited to a nonvolatile memory cell storing multiple values such as four bits but, naturally, a nonvolatile memory cell storing information of two bits may be also employed. Further, a nonvolatile memory cell in the flash memory is not limited to a stacked gate structure but may employ a split gate structure in which a selection transistor part and a memory transistor part are arranged in series.

Although the case of applying the invention achieved by the inventors herein to a memory card on which the AND-type flash memory is mounted and a memory card on which the AG-AND type flash memory is mounted as the utilization field which is the background has been described, the invention can be also applied to a memory card on which an NAND-type flash memory is mounted and a memory card on which an NOR-type flash memory is mounted.

What is claimed is:

1. A nonvolatile memory apparatus comprising:

an electrically rewritable nonvolatile memory; and a card controller which performs a memory control and an external interface control, wherein said electrically rewritable nonvolatile memory has a nonvolatile memory part having a plurality of memory cells, said nonvolatile memory part including, as nonvolatile memory areas, a plurality of physical address areas, each of which corresponds to a logical address, and a save area which saves data stored in an arbitrary one of said physical address areas, wherein in a first accessing in response to a data write instruction on a required logical address received from outside thereof, said card controller stores a first data stored in a first physical address area corresponding to said required logical address to said save area, and writes a second data into said first physical address area and, wherein when a writing incompletion of said first physical address area is detected at an accessing to said first physical address area different from said first accessing in response to said data write instruction, said card controller performs a control of writing said first data stored in said save area to said first physical address area.

2. The nonvolatile memory apparatus according to claim 1, wherein an incomplete state of writing of said first physical address area is state in which a threshold voltage of one or more memory cells of said first physical address area is in a negative voltage level due to power shut-down which occurs during said first accessing.

3. The nonvolatile memory apparatus according to claim 1, wherein an incomplete state of writing of said first physical address area denotes absence of valid write data in the physical address area.

4. The nonvolatile memory apparatus according to claim 1, wherein an address translation table to translate between a logical address and a physical address is stored in said nonvolatile memory area, wherein each said physical address area and said save area has a data area and a management area for the data area, and wherein said management area in said save area holds said required logical address of said first data stored in said save area.

5. The nonvolatile memory apparatus according to claim 4, wherein said management area holds flag information indicative of validity of data held in a corresponding data area.

6. The nonvolatile memory apparatus according to claim 5, wherein an erasing process is performed before performing a writing process in response to said data write instruction on said nonvolatile memory area, wherein each said physical address area and said save area is divided into one or more erase units, each said erase unit having a size which is multiple times as large a write data unit, and wherein said flag information has a plurality of bits capable of indicating validity of data on said write data unit basis.

7. The nonvolatile memory apparatus according to claim 6, wherein in a case of rewriting part of data written in one write data unit with rewrite data in one erase unit in said first physical address area corresponding to said required logical address related to said data write instruction, said card controller performs a control of storing said first data stored in said first physical address area into said save area, erasing data stored in a first erase unit including said first physical address area, writing said rewrite data into a part of said first physical address area, maintaining another part of said first physical address area in an erase state, and maintaining another part of said first data stored in said save area in a valid state.

8. The nonvolatile memory apparatus according to claim 7, wherein in a case where said another part of said first data in said save area remains in a valid state, in a second accessing in response to said data write instruction corresponding to a second physical address area included in a second erase unit, said card controller stores said another part of said first data stored in said save area into said first physical address area, and, after that, performs a control of storing a third data stored in said second physical address area to said save area.

9. The nonvolatile memory apparatus according to claim 5, wherein when validity of a physical address area corresponding to a required logical address of a third accessing in response to a data read instruction cannot be confirmed, said card controller checks that a data of said required logical address in response to said data read instruction is stored in said save area and outputs a data in the save area to the outside.

10. The nonvolatile memory apparatus according to claim 1, wherein writing of said first data from said save area to said first physical address area, which is performed when detecting said writing incompletion thereof, is performed in response to power-on reset.

11. The nonvolatile memory apparatus according to claim 2, wherein writing of said first data from said save area to said first physical address area, which is performed when detecting said writing incompletion thereof, is performed in response to a result of execution of a depletion check command.

12. The nonvolatile memory apparatus according to claim 5, wherein said electrically rewritable nonvolatile memory has a plurality of sets, each of which includes said nonvolatile memory part and a volatile buffer part corresponding to said nonvolatile memory part, and an erase unit of said nonvolatile memory part which is multiple times the size of a write data unit, said volatile buffer part having storage capacity of said write data unit, wherein said electrically rewritable nonvolatile memory temporarily stores storage data in a physical address area to be rewritten into volatile buffer parts of both of a nonvolatile memory part to be rewritten and another nonvolatile memory part in response to a rewriting operation instruction given from said card controller, and wherein said card controller performs a control of writing said storage data stored in said volatile buffer parts to said save area of nonvolatile memory part corresponding to said physical address area.

* * * * *